United States Patent
Ozawa

(10) Patent No.: US 8,045,664 B2
(45) Date of Patent: *Oct. 25, 2011

(54) CLOCK DATA RECOVERY DEVICE

(75) Inventor: Seiichi Ozawa, Wako (JP)

(73) Assignee: Thine Electronics, Inc., Tokyo (JP)

( * ) Notice: Subject to any disclaimer, the term of this patent is extended or adjusted under 35 U.S.C. 154(b) by 99 days.

This patent is subject to a terminal disclaimer.

(21) Appl. No.: 12/444,607

(22) PCT Filed: Sep. 6, 2007

(86) PCT No.: PCT/JP2007/067400
§ 371 (c)(1),
(2), (4) Date: Apr. 21, 2009

(87) PCT Pub. No.: WO2008/044407
PCT Pub. Date: Apr. 17, 2008

(65) Prior Publication Data
US 2010/0026350 A1     Feb. 4, 2010

(30) Foreign Application Priority Data
Oct. 11, 2006    (JP) ................................. 2006-277925

(51) Int. Cl.
*H04L 7/00* (2006.01)

(52) U.S. Cl. ........ 375/355; 375/356; 375/360; 375/375; 375/220; 375/327

(58) Field of Classification Search .................. 375/355, 375/356, 360, 373, 375, 376, 220, 327
See application file for complete search history.

(56) References Cited

U.S. PATENT DOCUMENTS

| 7,433,440 | B2 | 10/2008 | Noguchi et al. | |
|---|---|---|---|---|
| 2003/0165207 | A1 | 9/2003 | Noguchi et al. | |
| 2005/0084048 | A1* | 4/2005 | Wu | 375/355 |
| 2005/0259764 | A1 | 11/2005 | Hung Lai et al. | |
| 2006/0034394 | A1* | 2/2006 | Popescu et al. | 375/326 |
| 2006/0055472 | A1* | 3/2006 | Bietti et al. | 331/57 |
| 2006/0062341 | A1* | 3/2006 | Edmondson et al. | 375/376 |

FOREIGN PATENT DOCUMENTS

| EP | 1331779 A1 | 7/2003 |
|---|---|---|
| EP | 1363399 A2 | 11/2003 |
| EP | 1626547 A2 | 2/2006 |
| JP | 64-060134 A | 3/1989 |
| JP | 01-125153 A | 5/1989 |
| JP | 07-221800 A | 8/1995 |
| JP | 2003-258924 A | 9/2003 |
| JP | 2004-507963 A | 3/2004 |
| WO | 00/11830 A2 | 3/2000 |

* cited by examiner

*Primary Examiner* — Kabir A Timory
(74) *Attorney, Agent, or Firm* — Sughrue Mion, PLLC

(57) ABSTRACT

A clock/data recovery device 1 comprises a sampler 10, a detector 20, an offset determination part 30, a clock output part 40, and a DA converter 50. The phases of clock signals CK and CKX are adjusted so as to match with the phase of an input digital signal. An offset amount (±Voff) added in the sampler 10 is adjusted so as to match with a peak time of a data transition time distribution of a first signal in a case where a value D(n−1) is HIGH level, and is adjusted so as to match with a peak time of a data transition time distribution of a second signal in a case where the value D(n−1) is LOW level. Either of the clock signals CK and CKX is outputted as the recovered clock signal. Time series data of a digital value D(n) is outputted as the recovered data.

7 Claims, 19 Drawing Sheets

*Fig.7*

| D(n-1) | DX(n-1) | D(n) | UP | DN |
|---|---|---|---|---|
| 0 | 0 | 0 | 0 | 0 |
| 0 | 0 | 1 | 0 | 1 |
| 0 | 1 | 0 | 0 | 0 |
| 0 | 1 | 1 | 1 | 0 |
| 1 | 0 | 0 | 1 | 0 |
| 1 | 0 | 1 | 0 | 0 |
| 1 | 1 | 0 | 0 | 1 |
| 1 | 1 | 1 | 0 | 0 |

| | T(n-9) | T(n-8) | T(n-7) | T(n-6) | T(n-5) | T(n-4) | T(n-3) | T(n-2) | T(n-1) | T(n) |
|---|---|---|---|---|---|---|---|---|---|---|
| | | UP | DN | | DN | | UP | | DN | |

(b)

| | UP | UP | | UP | | UP | | UP | |
|---|---|---|---|---|---|---|---|---|---|

(c)

| | DN | DN | | DN | | DN | | DN | |
|---|---|---|---|---|---|---|---|---|---|

CLOCK DATA RECOVERY DEVICE

CROSS REFERENCE TO RELATED APPLICATION

This application is a National Stage of International Application No. PCT/JP2007/067400 filed Sep. 6, 2007, claiming priority based on Japanese Patent Application No. 2006-277925, filed Oct. 11, 2006, the contents of all of which are incorporated herein by reference in their entirety.

TECHNICAL FIELD

The present invention relates to a device for recovering a clock signal and data based on an input digital signal.

BACKGROUND ART

The waveform of a digital signal outputted from a transmitter degrades while being transmitted from the transmitter to a receiver via a transmission channel, requiring that the clock signal and data be recovered at the receiver. Clock/data recovery devices for carrying out this kind of recovery, for example, are disclosed in Patent Documents 1, 2.

The devices disclosed in these documents take into account the fact that data transition times fluctuate in the waveform-degraded digital signal, and detect each bit of data at three timings. Of the three timings when each bit of data is detected at this time, a first timing is set in proximity to the start time of the data stability period of the pertinent bit, a second timing is set in proximity to the end time of the data stability period of the pertinent bit, and a third timing is set at a middle time between the first timing and the second timing.

Then, the device disclosed in Patent Document 1 recovers the clock signal by adjusting the respective timings such that all the data detected at the three timings for each bit matches, and recovers the data at this time by detecting the data of each bit at the middle third timing.

Conversely, the device disclosed in Patent Document 2 recovers the clock signal by adjusting each timing such that the bit error rates for each of the first timing and the second timing (that is, rates at which the data detected at each of these timings differs from the data detected at the middle third timing) are equivalent to one another, and, in addition, lie within the start setting range, and recovers data by detecting the data of each bit at this time at the middle third timing.

[Patent Document 1] Japanese Patent Application Laid-open No. H7-221800
[Patent Document 2] National Publication of Translated Version No. 2004-507963

DISCLOSURE OF THE INVENTION

Problem to be Solved by the Invention

Now then, the data transition time of an input digital signal fluctuates as a result of transmitter clock jitter, which is caused by fluctuations in the power source voltage and other such noise in the transmitter that sent the digital signal, and also fluctuates due to intersymbol interference caused by the mixing of irregular data patterns in the digital signal with the attenuation in the transmission channel. There are cases in which the above-mentioned prior art devices may not be able to recover the clock signal and data when the transmitter clock jitter and intersymbol interference are high.

An object of the present invention, which was conceived to solve for the above-mentioned problems, is to provide a clock/data recovery device that makes it possible to stably recover a clock signal and data even when transmitter clock jitter and intersymbol interference are high.

Means for Solving the Problem

A clock/data recovery device related to the present invention is for recovering a clock signal and data on the basis of an input digital signal, and comprises a sampler, a detector, an offset determination part, and a clock output part.

The sampler receives an input of a clock signal CK and a clock signal CKX, which have the same cycle T, and also receives an input of the digital signal, sets a signal to which an offset (−Voff) has been added to the digital signal as a first signal, sets a signal to which an offset (+Voff) has been added to the digital signal as a second signal, and in each $n^{th}$ period T(n) of this cycle, samples, holds and outputs a digital value DA(n) of the first signal and a digital value DB(n) of the second signal at a time $t_C$ indicated by the clock signal CK, and samples, holds and outputs a digital value DXA(n) of the first signal and a digital value DXB(n) of the second signal at a time $t_X$ indicated by the clock signal CKX. Here, "$t_C < t_X$" and n is an integer.

The detector, in each period T(n), receives an input of the value DA(n), value DB(n), value DXA(n) and value DXB(n) outputted from the sampler, determines a value D(n) and a value DX(n−1) by setting "D(n)=DA(n)" and "DX(n−1)=DXA (n−1)" in a case where a value D(n−1) is HIGH level and setting "D(n)=DB(n)" and "DX(n−1)=DXB (n−1)" in a case where a value D(n−1) is LOW level, and detects a phase relationship between the clock signal CK and the digital signal on the basis of the value D(n−1), value DX(n−1) and value D(n).

The offset determination part, in each period T(n), receives an input of the value D(n) and value DX(n) determined by the detector, and determines an amount of an offset (±Voff) added in the sampler such that a time indicated by the clock signal CKX constitutes the center of a transition time distribution of a value of the first signal in a case where the value D(n−1) is HIGH level, and a time indicated by the clock signal CKX constitutes the center of a transition time distribution of a value of the second signal in a case where the value D(n−1) is LOW level.

The clock output part adjusts either the cycle T or phase on the basis of the phase relationship detected by the detector such that a phase difference between the clock signal CK and the digital signal decreases, and outputs to the sampler the clock signal CK and the clock signal CKX that satisfy the relationship "$t_X - t_C = T/2$".

The clock/data recovery device related to the present invention, which is configured in this manner, has a first loop comprising the sampler, the detector and the clock output part, and also has a second loop comprising the sampler, the detector and the offset determination part. By the processing of these two loops, the respective phases of the clock signal CK and the clock signal CKX are adjusted to match the phase of the input digital signal. Further, the amount of an offset (±Voff) added in the sampler is adjusted so as to match the peak time of the data transition time distribution of the first signal in a case where a value D(n−1) is HIGH level, and is adjusted so as to match the peak time of the data transition time distribution of the second signal in a case where a value D(n−1) is LOW level. Then, either one of the clock signal CK and the clock signal CKX is outputted as the recovered clock signal. Further, time-series data of a digital value D(n) is outputted as the recovered data.

The detector preferably comprises a phase relationship detection circuit that outputs, as a signal representing the phase relationship, a UP signal which constitutes a significant value when "D(n−1)≠DX(n−1)=D(n)", and a DN signal which constitutes a significant value when "D(n−1)=DX(n−1)≠D(n)".

The clock output part preferably adjusts either the cycle T or the phase on the basis of the UP signal and the DN signal, and outputs the clock signal CK and the clock signal CKX.

The offset determination part preferably determines the amount of an offset added in the sampler such that the difference between a value of 0.5 and the ratio (cntINSIDE/cntEDGE) of a cumulative addition value cntINSIDE of "{D(n)^D(n−1)}*{D(n−2)^DX(n−1)}" and a cumulative addition value cntEDGE of "D(n)^D(n−1)" is not greater than a reference value.

In each period T(n), only in a case where there exists a period in which the UP signal and the DN signal respectively constitute the significant value within past 10 consecutive periods (T(n−9) through T(n)) including this period, the offset determination part preferably cumulatively adds "{D(n)^D(n−1)}*{D(n−2)^DX(n−1)}" to determine the cumulative addition value cntINSIDE, and cumulatively adds "D(n)^D(n−1)" to determine the cumulative addition value cntEDGE, and determines the amount of an offset added in the sampler such that the difference between the value of 0.5 and the ratio (cntINSIDE/cntEDGE) is not greater than a reference value.

Further, the offset determination part preferably corrects the added offset amount in accordance with a value D(n−2) in each period T(n).

Effect of the Invention

According to the present invention, it is possible to stably recover a clock signal and data even when transmitter clock jitter and intersymbol interference are high.

BRIEF DESCRIPTION OF THE DRAWINGS

FIG. 7 is a table showing a truth table of the input-output values of a phase relationship detection circuit 24 included in the detector 20;

FIG. 17 is a diagram illustrating the processing in the offset determination part 30A included in the clock/data recovery device 2 related to the second embodiment;

EXPLANATIONS OF REFERENCE NUMERALS

Figure 1:
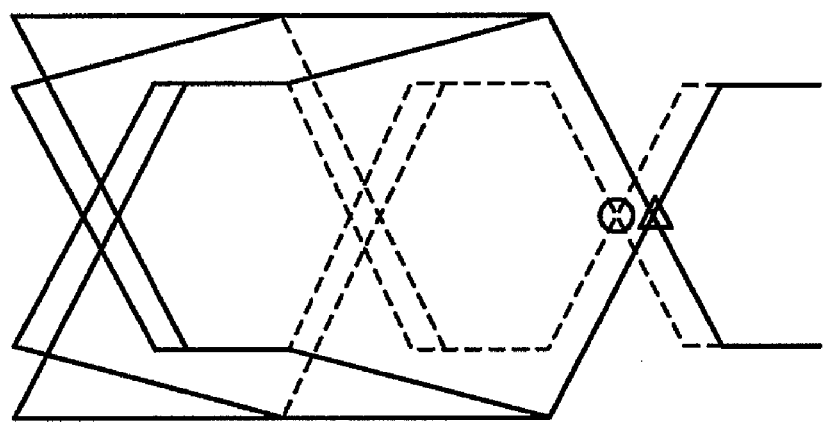
FIG. 1 is a diagram schematically showing an eye pattern of a waveform-degraded digital signal.

1 . . . clock/data recovery device, 10 . . . sampler, 11 through 14 . . . latch circuit, 15 through 18 . . . addition circuit, 20 . . . detector, 21 . . . register circuit, 22, 23 . . . selection circuit, 24 . . . phase relationship detection circuit, 30, 30A, 30B . . . offset determination part, 40 . . . clock output part, 41 . . . reference clock generation circuit, 42 . . . delay circuit, 50 . . . DA converter

BEST MODES FOR CARRYING OUT THE INVENTION

The best modes for carrying out the present invention will be explained in detail below by referring to the attached drawings. Furthermore, to avoid prolixity, the same reference numerals have been designated for the same elements in the descriptions of the drawings.

The present invention was conceived by taking into account the pattern effect that occurs in a waveform-degraded digital signal. Accordingly, the pattern effect will be explained first. FIG. 1 is a diagram schematically showing an eye pattern of a waveform-degraded digital signal. The pattern effect exerted on the temporal axis of a digital signal will be looked at first. As shown in this figure, when a waveform-degraded digital signal is analyzed, the time at which data transitions from one bit to the next bit depends on the data pattern prior to this time. That is, the data transition time subsequent to a succession of the same data is relatively late (solid lines in the figure), whereas the data transition time subsequent to data having been changed is relatively early (broken lines in the figure).

Next, as for the pattern effect exerted on the voltage axis (level) of a digital signal, the level of a certain bit depends on the symbol of the preceding bit. That is, even for the same HIGH level, a bit will be a high HIGH level if the preceding bit is HIGH level, and will be a low HIGH level if the preceding bit is LOW level. The same holds true for LOW voltage levels. The subsequent transition of a certain bit depends on the voltage level of that bit. When transitioning from a high HIGH level to a LOW level, the transition time is late because the transition commences further away than in the case of a transition from a low LOW level. The same holds true for a transition from a low LOW level to a HIGH level. A high HIGH level and a low LOW level are realized when the two preceding bits have the same voltage level. Therefore, the transition time following two consecutive bits of the same level can be said to be late. Viewed from a different perspective, when transitioning from a high HIGH level to a LOW level, the waveform will be higher than when transitioning from a low LOW level. The same holds true when transitioning from a high LOW level to a HIGH level. A high HIGH level and a high LOW level are realized when the preceding bit is HIGH level. Therefore, the offset of the succeeding transition waveform will change depending on the level of the preceding bit. This phenomenon is called the pattern effect. A fluctuation in data transition time depends on the data patterns of the respective preceding bits, and in particular, depends largely on the respective data differences of the preceding two bits. Further, a data transition waveform depends on the levels of the preceding bits and possesses an offset.

Taking this pattern effect into account, first the present invention deals with the pattern effect exerted on the temporal axis of the digital signal by mutually segmenting and detecting a data transition time in a case where the data of at least the preceding two bits differ from one another, and a data transition time in a case where the data of at least the preceding two bits are equivalent to one another. The present invention, by making use of the fact that an equivalence relationship exists between a data timing adjustment and the addition of an offset, makes it so that a single clock signal CKX indicates the peak timing of a data transition time distribution and adjusts the amount of the offset Voff for both a first signal that adds the offset voltage value (−Voff) to the input digital signal and a second signal that adds the offset voltage value (+Voff) to the input digital signal.

Figure 2A:
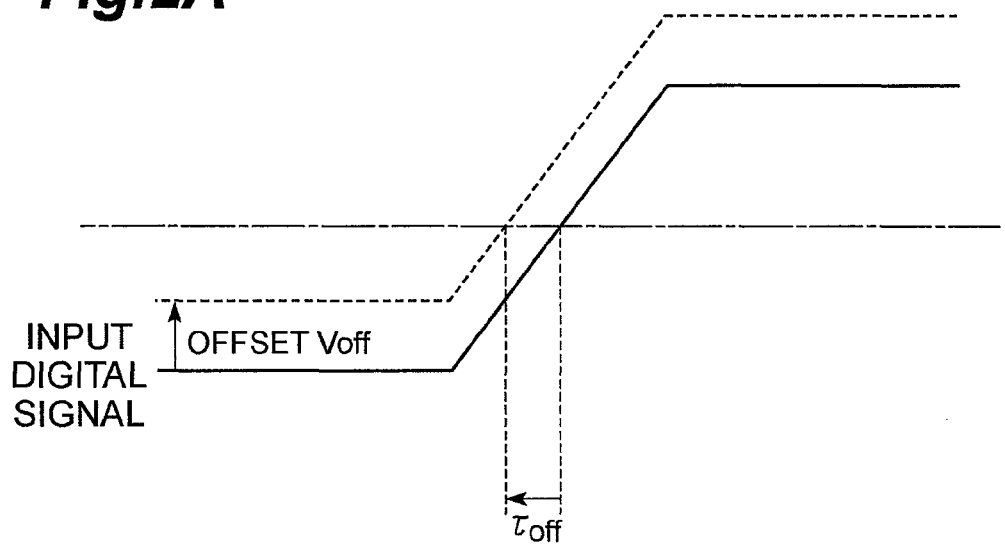
FIG. 2 is a diagram illustrating the relationship between the timing at which digital signal data is sampled and an offset.
Figure 2B:
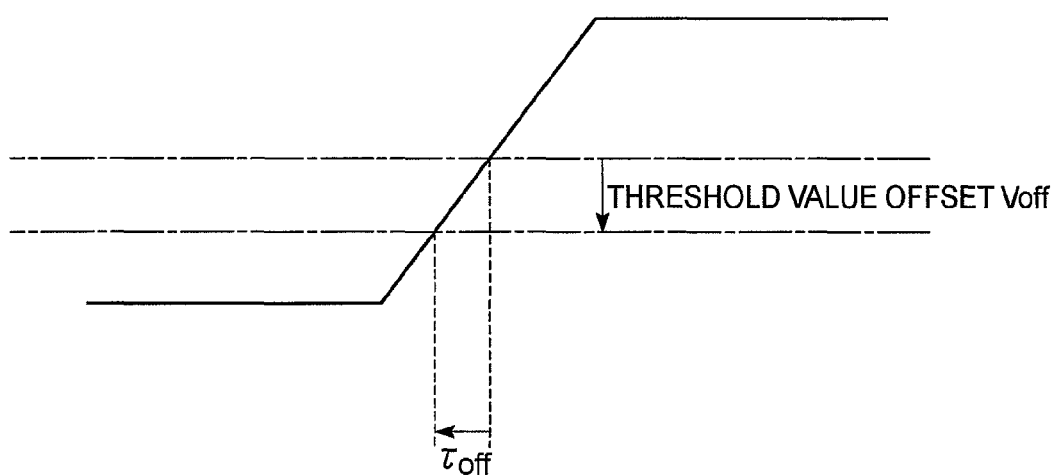

FIG. 2 is a diagram illustrating the equivalence relationship between the timing of a sampling of the above-mentioned digital signal data and an offset. In FIG. 2A, the signal represented by the broken line is obtained by adding an offset Voff to the input digital signal represented by the solid line. When the sampling of the signal to which the offset Voff has been added and the original input digital signal by the same latch circuit is considered, the timing of the sampling of the signal to which the offset Voff has been added is equivalent to timing which is time $\tau$off (=Voff/Slew Rate) earlier than the timing of the sampling of the original input digital signal. Further, the effect of sampling this input digital signal to which an offset Voff has been added by a latch circuit, as shown in FIG. 2B, may also be obtained by sampling an input digital signal to which an offset has not been added using a threshold (−Voff), that is, by adding an offset to a sampling threshold.

Figure 3A:
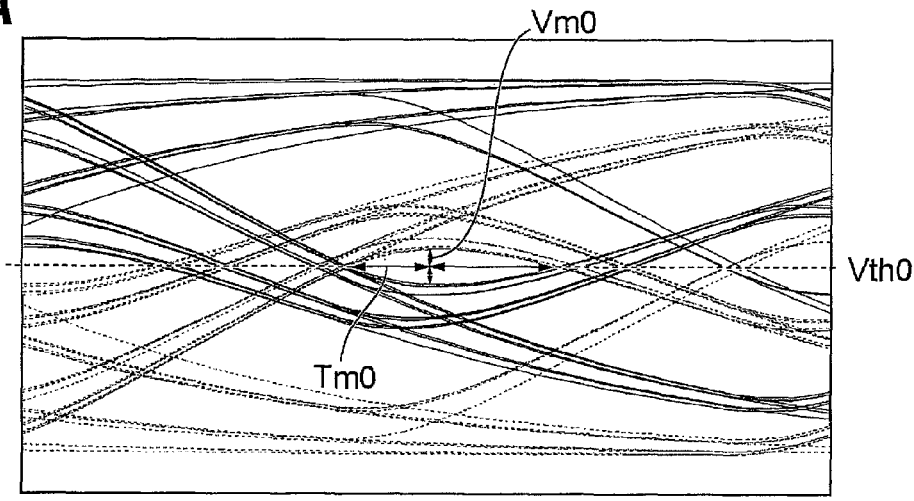
FIG. 3 is a diagram showing an example of the eye pattern on a waveform-degraded digital signal.
Figure 3B:
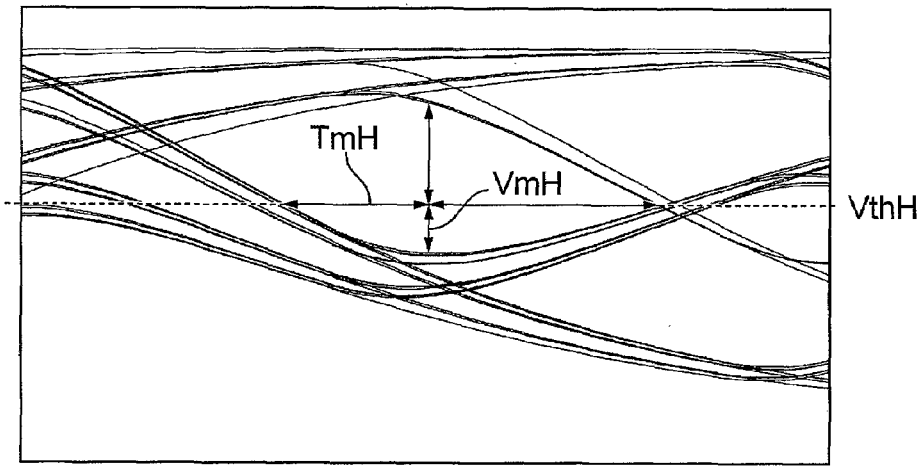
Figure 3C:
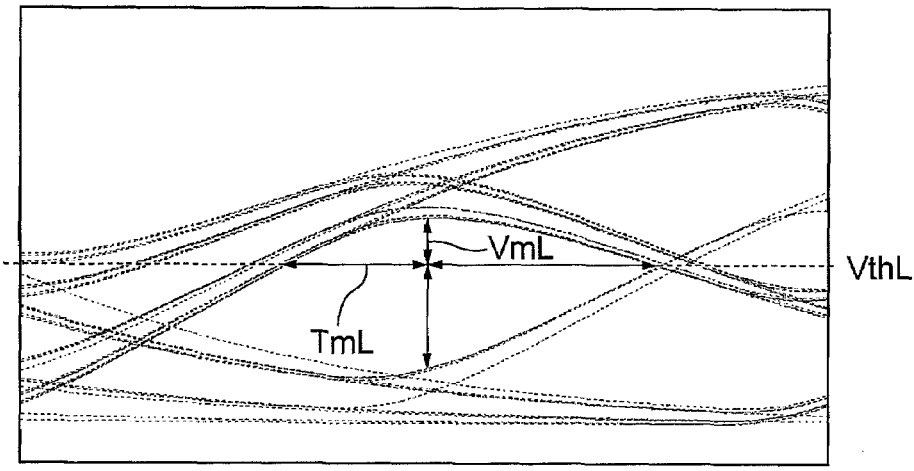
Figure 4:
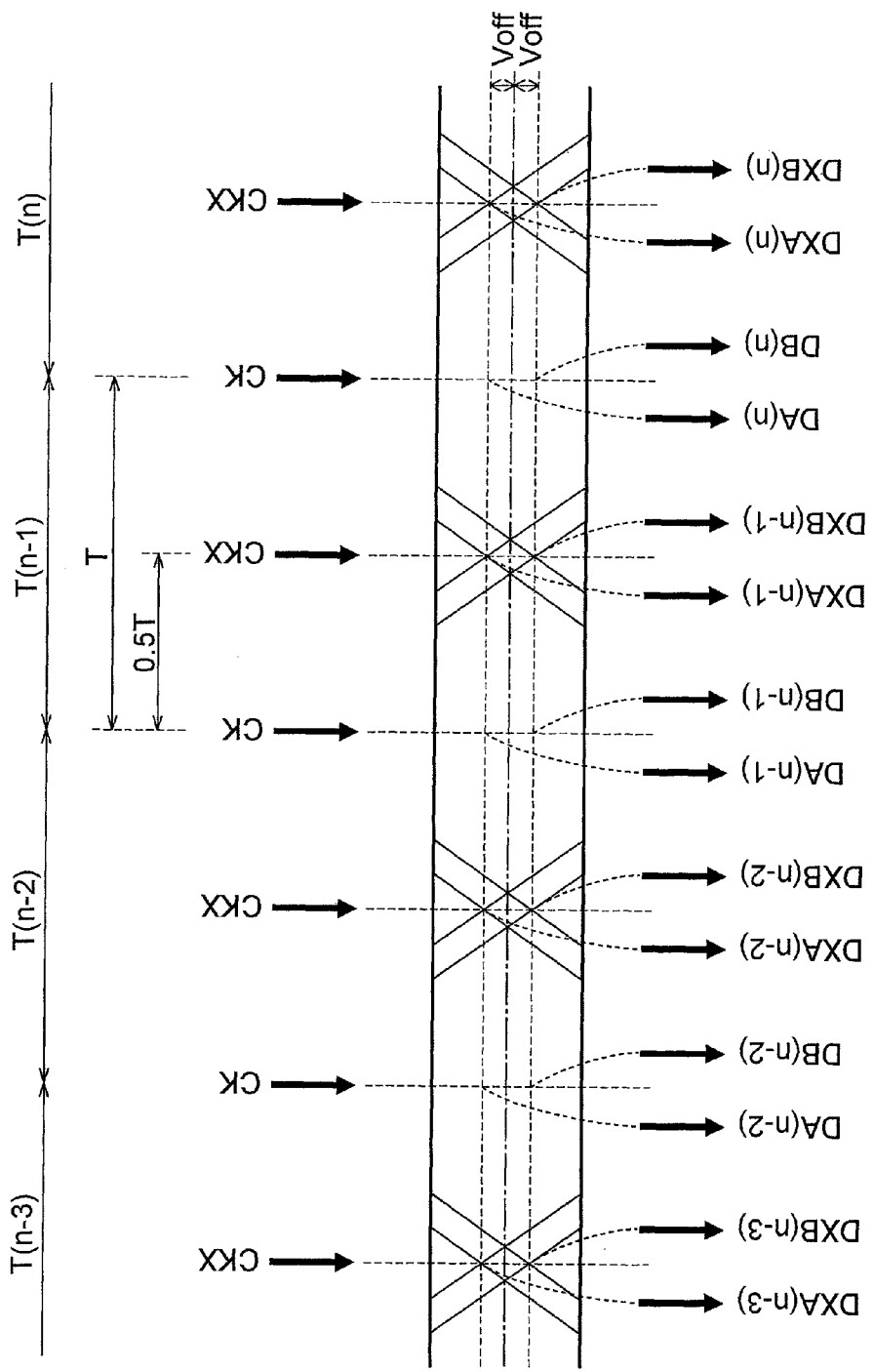
FIG. 4 is a diagram showing the timing at which digital signal data is sampled in a first embodiment.

Next, the pattern effect exerted on the voltage axis (level) of the above-mentioned digital signal will be explained. FIG. 3 is a diagram showing an example of an eye pattern of a waveform-degraded digital signal. FIG. 3A shows an eye pattern in a case where the data of the preceding one bit is a mixture of a HIGH level and a LOW level. FIG. 3B shows an eye pattern in a case where the data of the preceding one bit is only HIGH level. FIG. 3C shows an eye pattern of a case where the data of the preceding one bit is only LOW level. That is, FIG. 3A is obtained by superposing FIG. 3B and FIG. 3C.

As shown in FIG. 3A, when the data of the preceding one bit is a mixture of both a HIGH level and a LOW level, the eye of the eye pattern is narrow. For this reason, in a data level determination of a digital signal in a case where the data of the preceding one bit is HIGH level and a digital signal in a case where the data of the preceding one bit is LOW level carried out on the basis of a single voltage threshold level Vth0, there is the danger of the voltage margin Vm0 decreasing and the error rate increasing. Further, there is also the danger of the error rate increasing on the temporal axis due to the time width Tm0 for which a level determination is possible shortening as well.

However, as shown in FIG. 3B, the eye of the eye pattern in a case where the data of the preceding one bit is only HIGH level is wider than the case of FIG. 3A. Similarly, as shown in FIG. 3C, the eye of the eye pattern in a case where the data of the preceding one bit is only LOW level is wider than the case of FIG. 3A. However, the level of the eye of the eye pattern in the case where the data of the preceding one bit is only HIGH level differs from the level of the eye of the eye pattern in the case where the data of the preceding one bit is only LOW level.

Therefore, in the case where the data of the preceding one bit is only HIGH level (FIG. 3B), it is possible to obtain a voltage margin VmH that is larger than the voltage margin Vm0 by carrying out a data level determination based on a voltage threshold level VthH that is higher than the voltage threshold level Vth0, thereby making it possible to reduce the error rate. Further, on the temporal axis as well, it is possible to improve resistance to input jitter since the time width TmH for which a level determination is possible is also longer than the time width Tm0. Similarly, in the case where the data of the preceding one bit is only LOW level (FIG. 3C), it is possible to obtain a voltage margin VmL that is larger than the voltage margin Vm0 by carrying out a data level determination based on a voltage threshold level VthL that is lower than the voltage threshold level Vth0, thereby making it possible to reduce the error rate. Further, on the temporal axis as well, it is possible to improve resistance to input jitter since the time width TmL for which a level determination is possible is also longer than the time width Tm0. Furthermore, a more detailed study shows that the level of the eye of an eye pattern also differs in accordance with the level of the data of the one bit immediately before the preceding one bit.

The present invention makes use of the fact that an equivalence relationship exists between the adjustment of the voltage threshold level Vth and the addition of an offset to adjust the offset voltage value applied to the input digital signal based on the voltage threshold level being fixed and differing from the level of the data of the preceding one bit.

The present invention was conceived based on the knowledge obtained by studying in detail the eye patterns of waveform-degraded digital signals like those mentioned above. A first embodiment of the present invention, which will be explained hereinbelow, determines an added offset amount (±Voff), and recovers a clock signal and data by regarding a signal obtained by adding the offset (−Voff) to the input digital signal as a first signal and regarding a signal obtained by adding the offset (+Voff) to the input digital signal as a second signal, and performing the required processing for this first signal and second signal based on the difference of the eye levels between a case where the data of the preceding one bit is HIGH level (FIG. 3B) and a case where the data of the preceding one bit is LOW level (FIG. 3C). Further, a second embodiment of the present invention corrects, based on the difference with the level of the data of the one bit immediately before the preceding one bit, the added offset amount determined the same as in the first embodiment.

First Embodiment

Next, the first embodiment of the clock/data recovery device related to the present invention will be explained. FIG.

4 is a diagram showing the timing at which the data of the digital signal is sampled in the first embodiment. This figure schematically shows the digital signal eye pattern, and also shows the timing of the data sampling at CKX and CK. The clock/data recovery device 1 related to this embodiment indicates the timing for sampling in a data stability period with clock signal CK and indicates the timing for sampling during a data transition with clock signal CKX for a first signal and a second signal obtained by adding an offset (±Voff) to the digital signal.

Clock signal CK and clock signal CKX have the same cycle. The sampling time $t_C$ indicated by clock signal CK and the sampling time $t_X$ indicated by clock signal CKX have the relationship "$t_X - t_C = T/2$". Further, the sampling times indicated by the two clock signals CK and CKX are lined up in order in each of the $n^{th}$ periods T(n) of the cycle T, where n is an arbitrary integer.

It is supposed that the signal obtained by adding offset (−Voff) to the input digital signal is the first signal (=input digital signal −Voff) and that the signal obtained by adding offset (+Voff) to the input digital signal is the second signal (=input digital signal +Voff). In each period T(n), the value of the first signal sampled at a time indicated by clock signal CK is expressed as DA(n), the value of the second signal sampled at a time indicated by clock signal CK is expressed as DB(n), the value of the first signal sampled at a time indicated by clock signal CKX is expressed as DXA(n), and the value of the second signal sampled at a time indicated by clock signal CKX is expressed as DXB(n), where these cycles T and offset amounts Voff are adjusted by the clock/data recovery device 1.

Furthermore, each of the clock signal CK and the clock signal CKX may be either single phase or multiphase. For example, if a case where clock signal CK is a four-phase signal is considered, four clock signals CK<1>, CK<2>, CK<3>, and CK<4>, the respective cycles of which are 4T and the phases of which differ from one another in steps of π/2, are employed, and four latch circuits corresponding to these four clock signals CK<1> through CK<4> are provided in the sampler. Although the size of the circuitry in the sampler is large in the case of a multiphase clock signal, the speed required for each circuit block is relaxed.

Further, the two clock signals CK and CKX may be standalone clock signals or may be a common clock signal. In the case of the latter, the common clock signal has pulse width T/2 in cycle T, the leading edge of the common clock signal may represent clock signal CK, and the trailing edge of the common clock signal may represent clock signal CKX.

Figure 5:
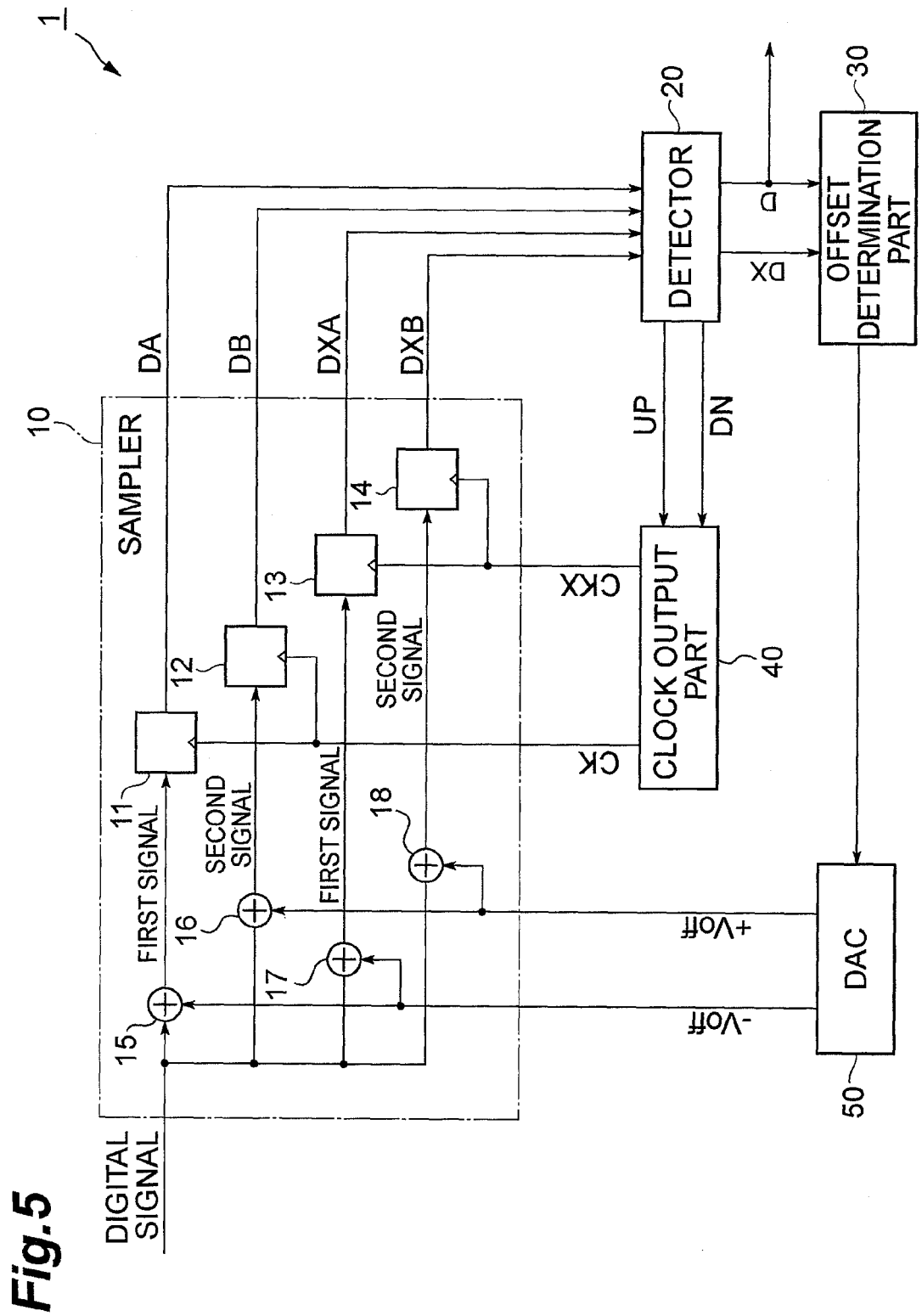
FIG. 5 is a diagram showing a simplified configuration of an entire clock/data recovery device 1 related to the first embodiment.

FIG. 5 is a diagram showing a simplified configuration of the entire clock/data recovery device 1 related to the first embodiment. As shown in this figure, the clock/data recovery device 1 comprises a sampler 10, a detector 20, an offset determination part 30, a clock output part 40 and a DA converter 50.

The sampler 10 comprises four latch circuits 11 through 14 and four addition circuits 15 though 18, receives an input of a clock signal CK and a clock signal CKX, which are outputted from the clock output part 40, and which have the same cycle T, receives an input of a voltage value (±Voff) outputted from the DA converter 50, and also receives an input of the digital signal targeted for recovery. Addition circuits 15, 17 add the offset voltage value (−Voff) to the input digital signal, and output a first signal, which is the result of this addition, to latch circuits 11, 13. Further, addition circuits 16, 18 add the offset voltage value (+Voff) to the input digital signal, and output a second signal, which is the result of this addition, to latch circuits 12, 14.

Latch circuit 11 samples and holds value DA(n) of the first signal at the time indicated by clock signal CK in each period T(n), and outputs same to the detector 20. Latch circuit 12 samples and holds value DB(n) of the second signal at the time indicated by clock signal CK in each period T(n), and outputs same to the detector 20. Latch circuit 13 samples and holds value DXA(n) of the first signal at the time indicated by clock signal CKX in each period T(n), and outputs same to the detector 20. In addition, latch circuit 14 samples and holds value DXB(n) of the second signal at the time indicated by clock signal CKX in each period T(n), and outputs same to the detector 20.

Furthermore, the configuration may also be such that, in addition to an offset being added to the input digital signal, the sampling threshold in each latch circuit is also offset. In accordance with this, the addition circuits 15 through 18 may be omitted. Further, in accordance with this, the respective latch circuits 11 through 14 will receive an input of a voltage value (either +Voff or −Voff), which is outputted from the DA converter 50. Then, the respective latch circuits 11 through 14, at the time indicated by either clock signal CK or clock signal CKX, sample and hold the input digital signal at a threshold shifted by either +Voff or −Voff, and output same to the detector 20. The DA converter 50 outputs the offset voltage (either +Voff or −Voff) itself that is in each of the latch circuits 11 through 14 here, but if the sampling threshold is a signal that is offset by either +Voff or −Voff for each of the latch circuits 11 through 14, the offset voltage (either +Voff or −Voff) itself may not be needed.

The detector 20 receives an input of a digital value DA(n), a digital value DB(n), a digital value DXA(n) and a digital value DXB(n) outputted from the sampler 10 in each period T(n). Then, the detector 20 recurringly determines value D(n) and also determines value DX(n−1) by setting "D(n)=DA(n)" and "DX(n−1)=DXA (n−1)" in a case where value D(n−1) is HIGH level, and setting "D(n)=DB(n)" and "DX(n−1)=DXB (n−1)" in a case where value D(n−1) is LOW level. Further, the detector 20 detects the phase relationship between clock signal CK and the digital signal on the basis of values D(n−1), DX(n−1) and D(n). The detector 20 outputs value D(n) and value DX(n) to the offset determination part 30, and outputs to the clock output part 40 the UP signal and the DN signal representing the phase relationship.

The offset determination part 30, in each period T(n), receives an input of a digital value D(n) and a digital value DX(n) outputted from the detector 20. Then, the offset determination part 30 determines the amount of an offset (±Voff) added in the sampler 10 such that the time indicated by clock signal CKX in a case where value D(n−1) is HIGH level constitutes the center of a transition time distribution of first signal values, and the time indicated by clock signal CKX in a case where value D(n−1) is LOW level constitutes the center of a transition time distribution of second signal values, and this determined added offset amount Voff is notified to the DA converter 50.

The clock output part 40 adjusts either the cycle T or phase on the basis of the UP signal and the DN signal representing the phase relationship detected by the detector 20 such that the phase difference between clock signal CK and the digital signal decreases, and outputs to the sampler 10 the clock signal CK and the clock signal CKX that satisfy the relationship "$t_X - t_C = T/2$". Further, the DA converter 50 outputs to the sampler 10 the added offset amount notified from the offset determination part 30 as an analog voltage value.

Figure 6:
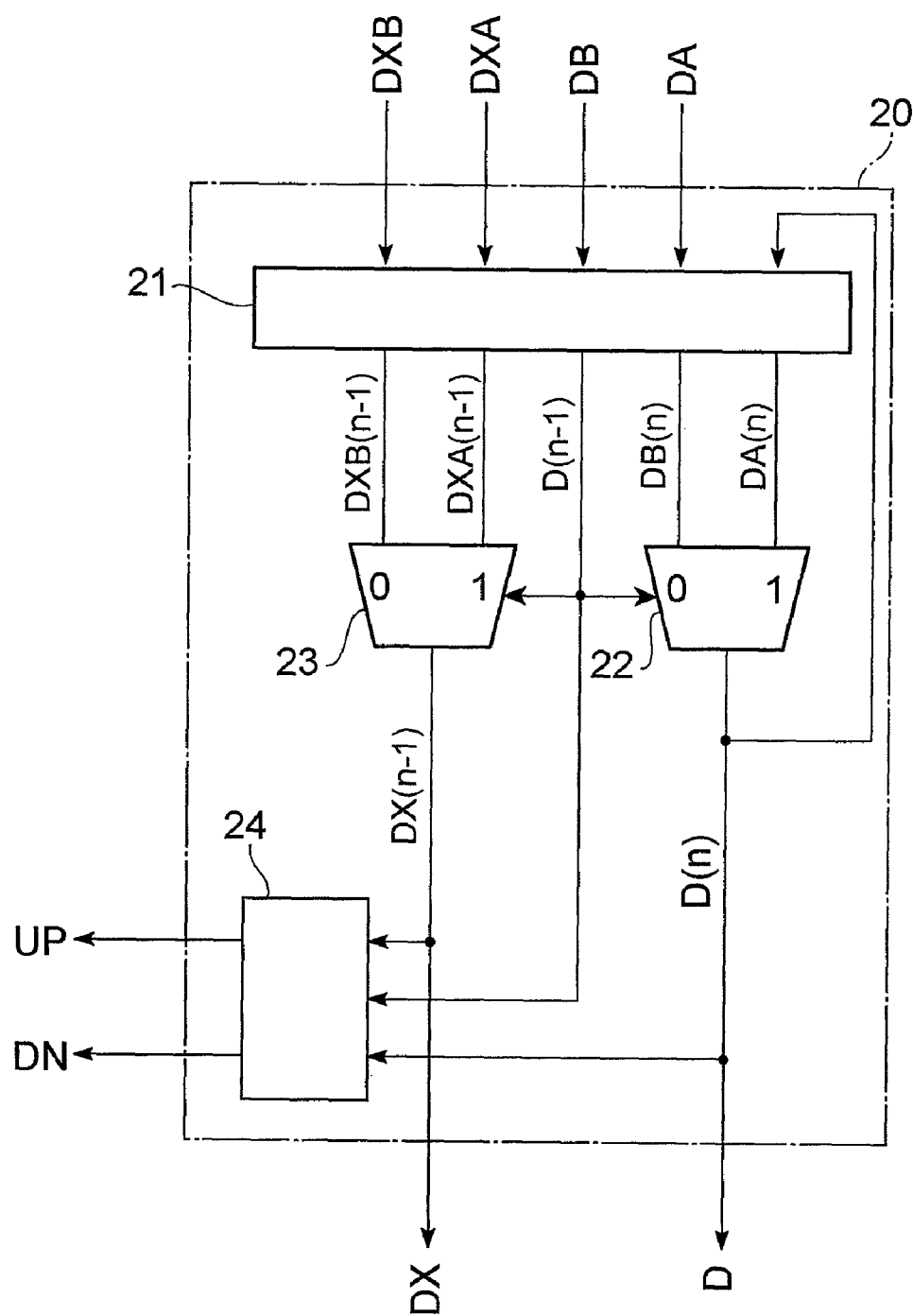
FIG. 6 is a circuit diagram of the detector 20 included in the clock/data recovery device 1 related to the first embodiment.

FIG. 6 is a circuit diagram of the detector 20 included in the clock/data recovery device 1 related to the first embodiment.

The detector 20 comprises a register circuit 21, a selection circuit 22, a selection circuit 23, and a phase relationship detection circuit 24.

The register circuit 21, in each period T(n), receives an input of a digital value DA (n), a digital value DB(n), a digital value DXA(n) and a digital value DXB(n), which are outputted from the sampler 10, and receives an input of a digital value D(n), which is outputted from the selection circuit 22, holds these values for a fixed period of time and outputs same at a predetermined timing. That is, the register circuit 21 outputs value DA(n), value DB(n), value DXA(n−1), value DXB(n−1) and value D(n−1) at the same time in a certain period.

The selection circuit 22 receives an input of value DA(n), value DB(n), and value D(n−1), which are outputted from register circuit 21, outputs value DA(n) as value D(n) in a case where value D(n−1) is HIGH level, and outputs value DB(n) as value D(n) in a case where value D(n−1) is LOW level.

The selection circuit 23 receives an input of value DXA(n−1), value DXB(n−1), and value D(n−1), which are outputted from register circuit 21, outputs value DXA(n−1) as value DX(n−1) in a case where value D(n−1) is HIGH level, and outputs value DXB(n−1) as value DX(n−1) in a case where value D(n−1) is LOW level.

The phase relationship detection circuit 24 receives an input of a value D(n−1), which is outputted from the register circuit 21, receives an input of a value D(n), which is outputted from the selection circuit 22, and receives an input of a value DX(n−1), which is outputted from the selection circuit 23, and outputs the UP signal and the DN signal by carrying out a logic operation in accordance with a truth table shown in FIG. 7. That is, the phase relationship detection circuit 24 outputs as a signal representing the phase relationship the UP signal, which constitutes the significant value in a case where "D(n−1)≠DX(n−1)=D(n)", and the DN signal, which constitutes the significant value in a case where "D(n−1)=DX(n−1)≠D(n)".

Figure 8:
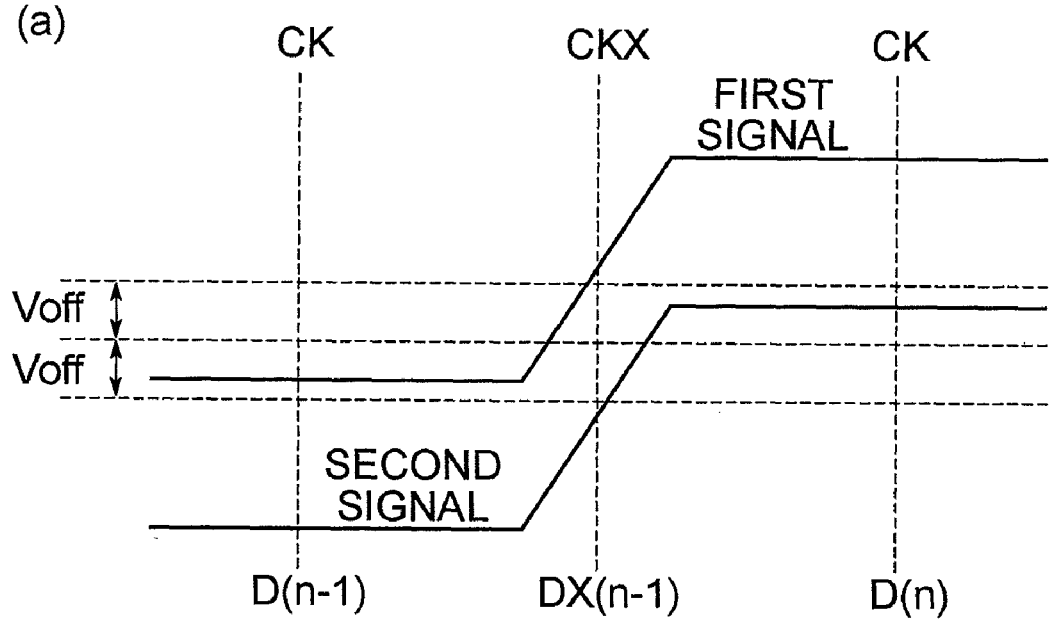
FIG. 8 is a diagram showing the relationship between a sampling time designated by clock signal CKX and an offset amount Voff.
Figure 8:
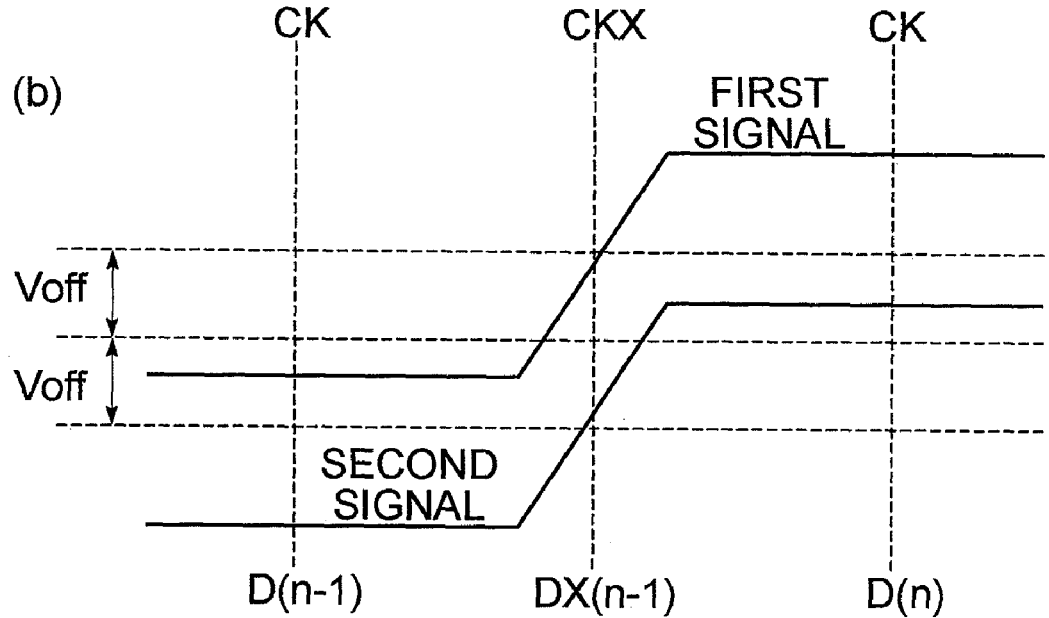

FIG. 8 is a diagram showing the relationship between a sampling time designated by clock signal CKX and an offset amount Voff. As shown in FIG. 8 (a), when the sampling time indicated by clock signal CKX in a case where value D(n−1) is HIGH level lags behind the center time of the transition time distribution of the values of the first signal, and the sampling time indicated by clock signal CKX in a case where value D(n−1) is LOW level is earlier than the center time of the transition time distribution of the values of the second signal, the offset amount Voff has to be increased.

Conversely, as shown in FIG. 8 (b), when the sampling time indicated by clock signal CKX in a case where value D(n−1) is HIGH level is earlier than the center time of the transition time distribution of the values of the first signal and the sampling time indicated by clock signal CKX in a case where value D(n−1) is LOW level lags behind the center time of the transition time distribution of the values of the second signal, the offset amount Voff has to be decreased. Furthermore, this figure depicts a case where the value of the digital signal transitions from LOW level to HIGH level, but it is the same in a case where the value of the digital signal transitions from HIGH level to LOW level.

Figure 9:
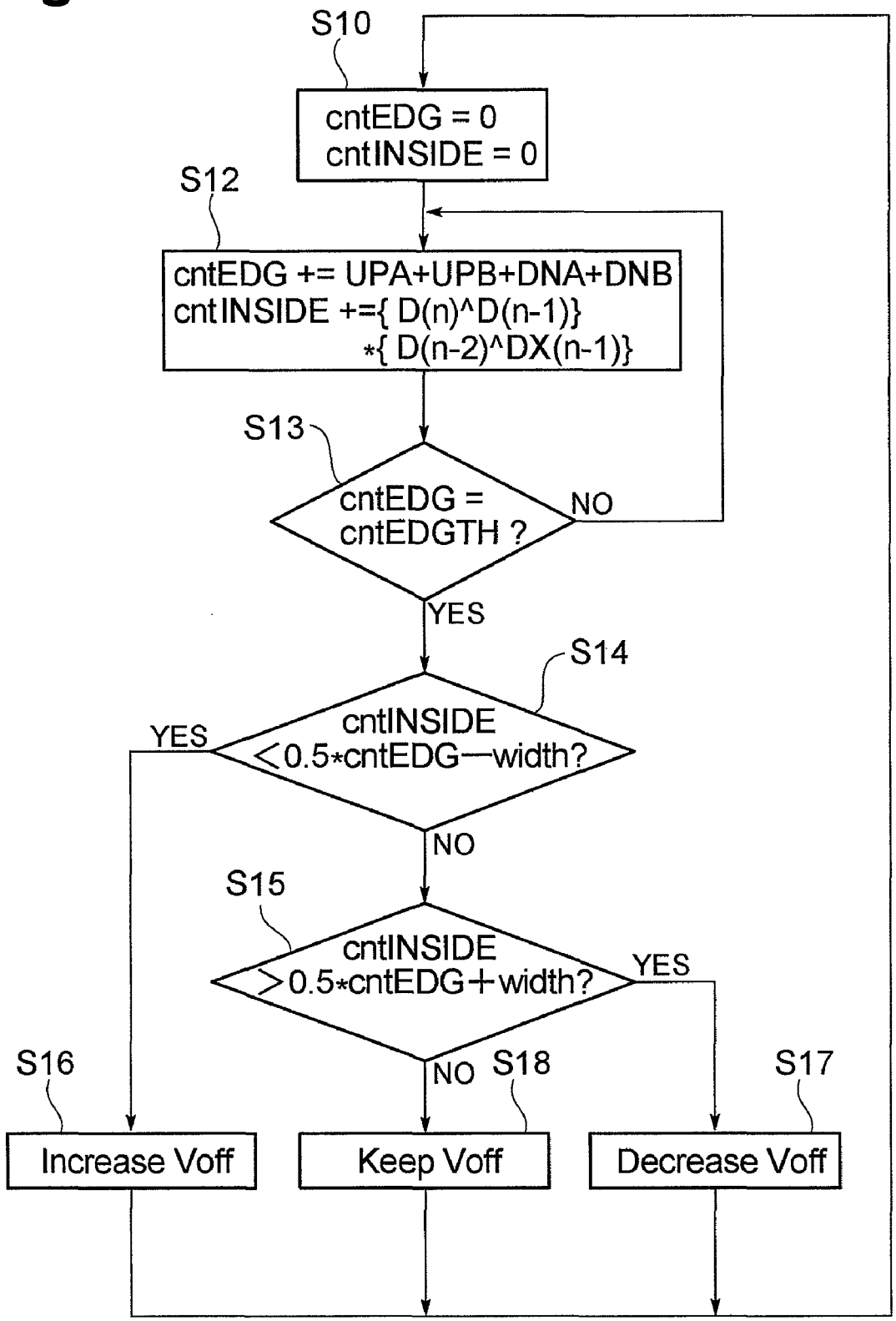
FIG. 9 is a flowchart illustrating the processing in the offset determination part 30 included in the clock/data recovery device 1 related to the first embodiment.

The offset determination part 30 makes a determination and adjusts the offset amount Voff as illustrated in FIG. 8. FIG. 9 is a flowchart explaining the processing in the offset determination part 30 included in the clock/data recovery device 1 related to the first embodiment. The offset determination part 30 utilizes a variable cntEDG, a variable cntINSIDE, a constant cntEDGTH, a constant width, a value D(n) and a value DX(n) to carry out the following processing. In Step S10, the offset determination part 30 sets the values of both variable cntEDG and variable cntINSIDE to the initial value 0. Next, in Step S12, the offset determination part 30 adds the value of "D(n)^D(n−1)" to the value of variable cntEDG and makes this addition value the new value of variable cntEDG. Further, in Step S12, the offset determination part 30 adds the value of "{D(n)^D(n−1)}*{D(n−2)^DX(n−1)}" to the value of variable cntINSIDE, and makes this addition value the new value of variable cntINSIDE. The operation symbol "^" here represents an exclusive OR. Next, in Step S13, the offset determination part 30 determines whether or not the value of the variable cntEDG is equivalent to the constant cntEDGTH, and if the value of the variable cntEDG reaches the constant cntEDGTH, proceeds to Step S14, and if the value of the variable cntEDG does not reach the constant cntEDGTH, returns to Step S12.

The processing of each of Step S12 and Step S13 is carried out one time in each period T(n). That is, the processing of Step S12 is carried out one time in each of the periods of cycle T until a determination is made in Step S13 that the value of the variable cntEDG has reached the constant cntEDGTH. Then, at the point when it is determined that the value of the variable cntEDG has reached the constant cntEDGTH in Step S13 and processing proceeds to Step S14, the ratio of the value of the variable cntINSIDE with respect to the value of the variable cntEDG denotes whether it is FIG. 8 (a) or (b).

In Step S14 and Step S15, the offset determination part 30 determines if the value of the variable cntINSIDE is in any way related to a fixed range, which is centered on a value 0.5 times the value of the variable cntEDG and which has a width of 2width. In a case where it is determined that the value of the variable cntINSIDE is smaller than the value obtained by subtracting the positive constant width from 0.5 times the value of the variable cntEDG (0.5*cntEDG-width), the offset determination part 30 adds an offset amount Voff in step S16 and notifies the new offset amount Voff to the DA converter 50. In a case where it is determined that the value of the variable cntINSIDE is larger than the value obtained by adding the positive constant width to 0.5 times the value of the variable cntEDG (0.5*cntEDG+width), the offset determination part 30 reduces the offset amount Voff in step S17 and notifies the new offset amount Voff to the DA converter 50. Further, in a case where it is determined that the value of the variable cntINSIDE lies within the above-mentioned fixed range, the offset determination part 30 maintains the offset amount Voff in step S18.

That is, in Steps S14 through S18, the offset determination part 30 carries out different processing in the three cases (a) through (c) as shown hereinbelow. Then, when the processing of any of Steps S16 through S18 is complete, the offset determination part 30 returns to step S10, and the processing described up to this point is repeated.

[E1]

(a) When "cntINSIDE<0.5*cntEDG−width"→increase Voff (b) When "0.5*cntEDG+width<cntINSIDE"→decrease Voff (c) When the value of cntINSIDE is within the fixed range→keep Voff In accordance with the offset determination part 30 carrying out the above-mentioned processing, the added offset amount (±Voff) is adjusted such that the value of the variable cntINSIDE falls within the fixed range (0.5*cntEDG−width through 0.5*cntEDG+width). In so doing, the clock signal CKX-indicated sampling time is adjusted so as to match the center time of the transition time distribution of the respective values of the first signal and the second signal.

Figure 10:
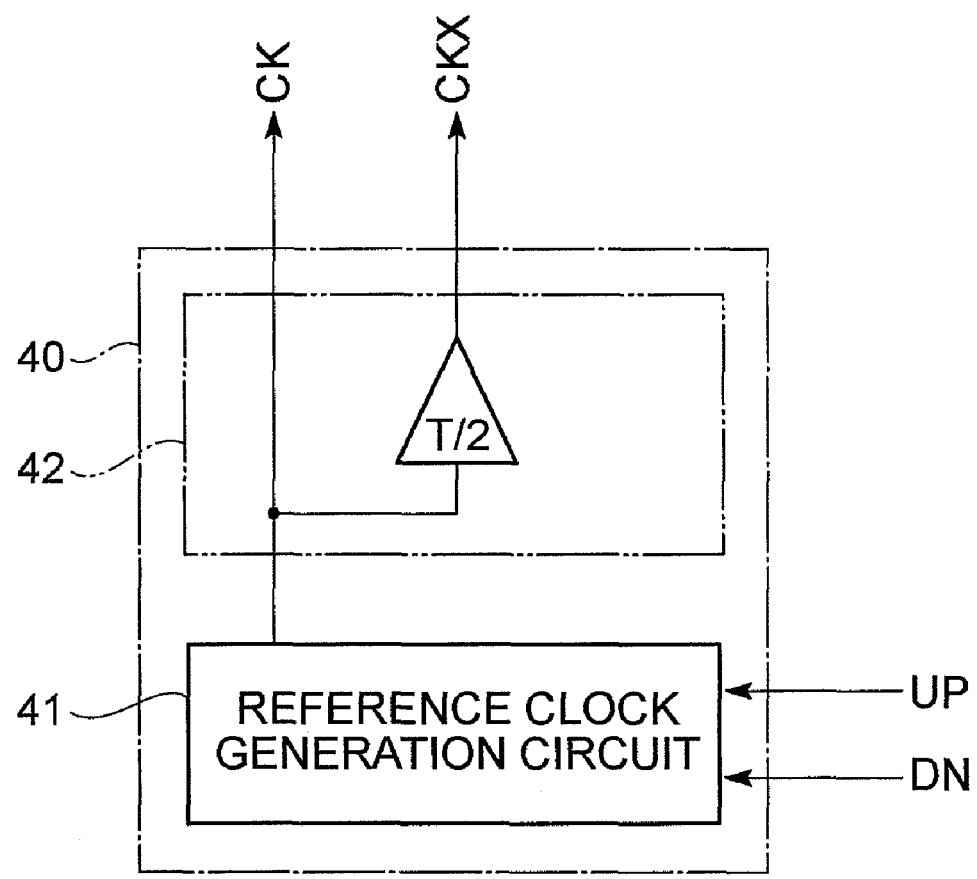
FIG. 10 is a diagram showing the configuration of the clock output part 40 included in the clock/data recovery device 1 related to the first embodiment.

The clock output part 40, based on the UP signal and the DN signal representing the phase relationship detected by the detector 20, adjusts either the cycle T or phase such that the phase difference between the clock signal CK and the digital signal decreases, and outputs to the sampler 10 the clock signal CK and the clock signal CKX. FIG. 10 is a diagram showing the configuration of the clock output part 40 included in the clock/data recovery device 1 related to the first embodiment. As shown in this figure, the clock output part 40 comprises a reference clock generation circuit 41 and a delay circuit 42.

Figure 11:
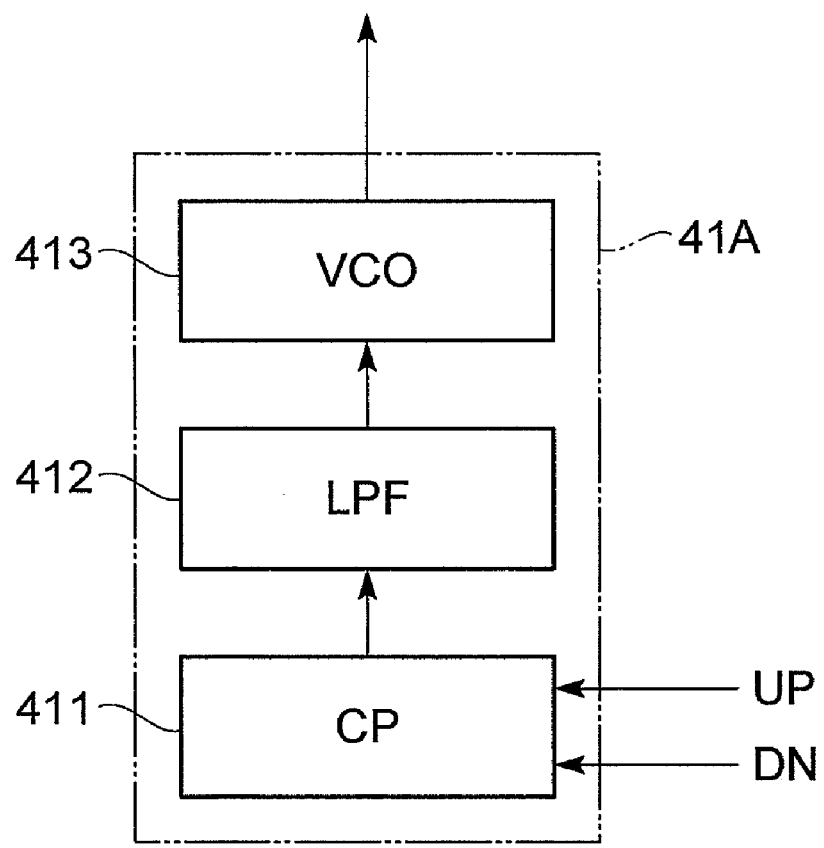
FIG. 11 is a diagram showing a circuit configuration of a first mode of a reference clock generation circuit 41.
Figure 12:
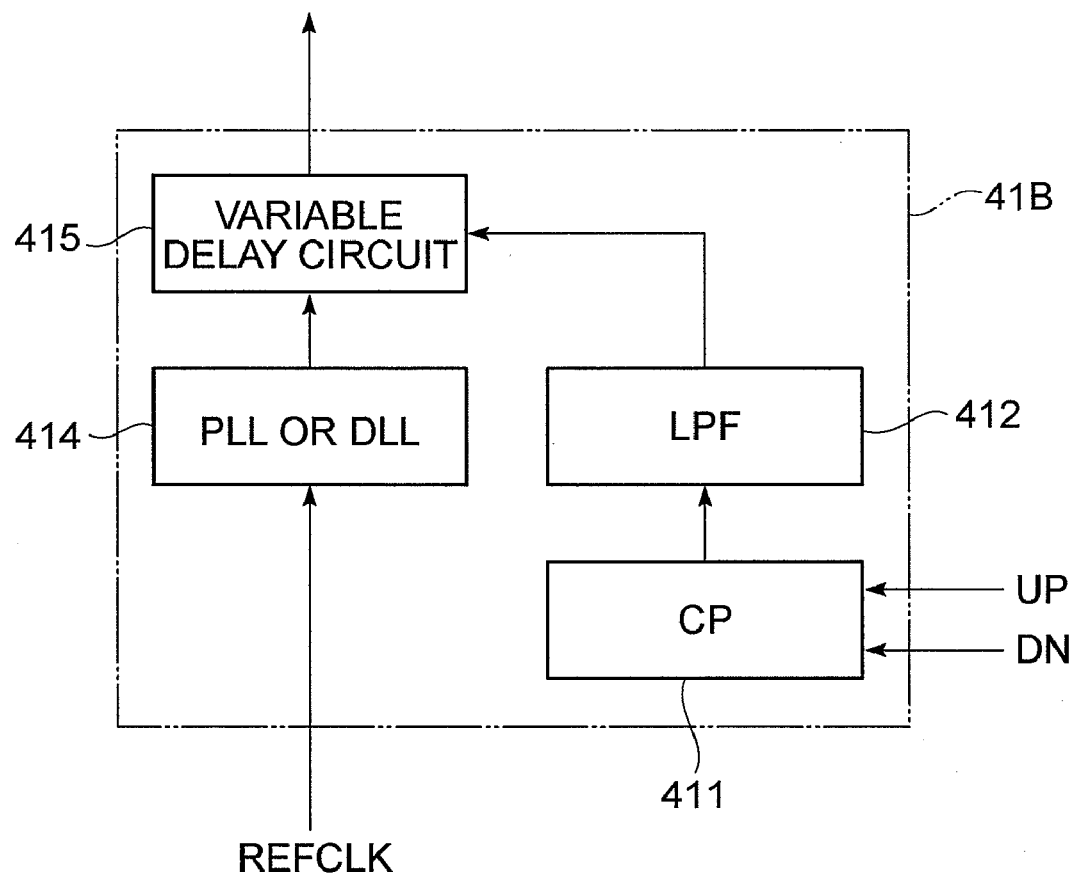
FIG. 12 is a diagram showing a circuit configuration of a second mode of a reference clock generation circuit 41.
Figure 13:
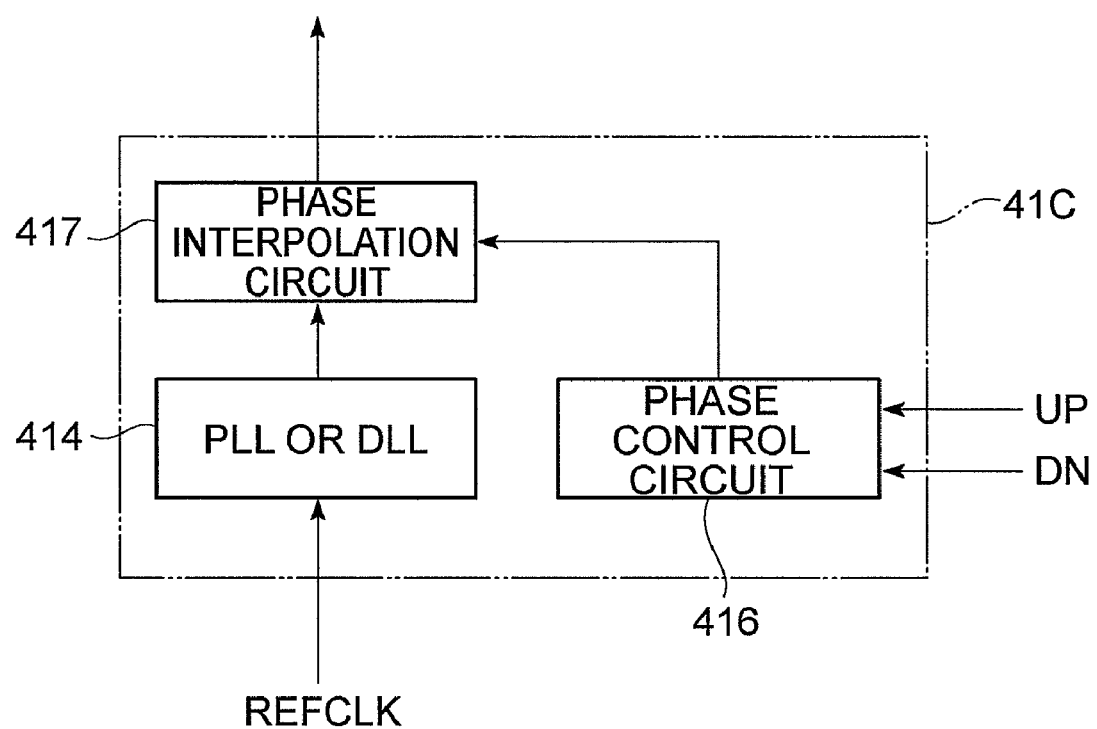
FIG. 13 is a diagram showing a circuit configuration of a third mode of a reference clock generation circuit 41.

The reference clock generation circuit 41 generates a reference clock signal that adjusts either the cycle T or phase based on the UP signal and the DN signal outputted from the detector 20. The circuit configuration of the reference clock generation circuit 41 may include various modes such as shown in FIGS. 11 through 13. The delay circuit 42 makes the reference clock signal outputted from the reference clock generation circuit 41 clock signal CK, applies a T/2 delay thereto to make the clock signal CKX, and outputs the clock signal CK and the clock signal CKX.

FIG. 11 is a diagram showing the circuit configuration of a first mode of the reference clock generation circuit 41. The reference clock generation circuit 41A shown in this figure comprises a CP (Charge Pump) circuit 411, an LPF (Lowpass Filter) circuit 412, and a VCO (Voltage-Controlled Oscillator) circuit 413. In the reference clock generation circuit 41A, the CP circuit 411, which receives an input of the UP signal and the DN signal outputted from the detector 20, outputs either a charging or discharging electric current pulse to the LPF circuit 412 in accordance with whether either of the UP signal and DN signal is the significant value. The LPF circuit 412 receives an input of the electric current pulse, which is outputted from the CP circuit 411, and increases or decreases the output voltage value in accordance with either the charging or discharging by the electric current pulse inputted thereto. The VCO circuit 413 then generates a clock signal of a cycle, which corresponds with the output voltage value from the LFP circuit 412, and outputs this reference clock signal to the delay circuit 42. The cycle of the clock signal outputted from the VCO circuit 413 to the delay circuit 42 is adjusted on the basis of the UP signal and the DN signal.

FIG. 12 is a diagram showing the circuit configuration of a second mode of the reference clock generation circuit 41. A reference clock generation circuit 41B, which is shown in this figure, comprises the CP circuit 411, the LPF circuit 412, a PLL (Phase Lock Loop) circuit 414, and the variable delay circuit 415. In this reference clock generation circuit 41B, the CP circuit 411, which receives an input of the UP signal and the DN signal outputted from the detector 20, outputs either a charging or discharging electric current pulse to the LPF circuit 412 in accordance with whether either of the UP signal and DN signal is the significant value. The LPF circuit 412 receives an input of the electric current pulse outputted from the CP circuit 411 and increases or decreases the output voltage value in accordance with either the charging or discharging by the electric current pulse inputted thereto. The PLL circuit 414 generates a multiphase clock from an input clock REFCLK and outputs this multiphase clock to the variable delay circuit 415. Then, the variable delay circuit 415 receives an input of the multiphase clock outputted from the PLL circuit 414, applies a delay, which corresponds to the voltage value outputted from the LPF circuit 412, to the multiphase clock, and outputs this delay-applied clock to the delay circuit 42. The phase of the clock signal outputted from the variable delay circuit 415 to the delay circuit 42 is adjusted on the basis of the UP signal and the DN signal. Furthermore, a DLL (Delay Lock Loop) circuit may be used in place of the PLL circuit.

FIG. 13 is a diagram showing the circuit configuration of a third mode of the reference clock generation circuit 41. The reference clock generation circuit 41C shown in this figure comprises the PLL circuit 414, a phase control circuit 416 and a phase interpolation circuit 417. In this reference clock generation circuit 41C, the phase control circuit 416, which receives an input of the UP signal and the DN signal outputted from the detector 20, outputs a control signal indicating an increase or decrease in the phase adjustment amount of the phase interpolation circuit 417 in accordance with whether either the UP signal or DN signal is the significant value. The PLL circuit 414 generates a multiphase clock from the input clock REFCLK and outputs the multiphase clock to the phase interpolation circuit 417. The phase interpolation circuit 417 then receives an input of the multiphase clock outputted from the PLL circuit 414, uses interpolation to adjust the phase of the multiphase clock on the basis of the control signal outputted from the phase control circuit 416, and outputs the phase-adjusted clock thereof to the delay circuit 42. The phase of the clock signal outputted from the phase interpolation circuit 417 to the delay circuit 42 is adjusted on the basis of the UP signal and the DN signal. Furthermore, a DLL circuit may be used in place of the PLL circuit.

The clock/data recovery device 1, which is configured in this manner, has a first loop comprising the sampler 10, the detector 20 and the clock output part 40, and also has a second loop comprising the sampler 10, the detector 20, the offset determination part 30 and the DA converter 50. By the processing of these two loops, the respective phases of the clock signal CK and the clock signal CKX are adjusted to match the phase of the input digital signal. The amount of an offset (±Voff) added in the sampler 10 is adjusted so as to match the peak time of the data transition time distribution of the first signal in a case where value D(n−1) is HIGH level, and is adjusted so as to match the peak time of the data transition time distribution of the second signal in a case where value D(n−1) is LOW level. Then, either one of the clock signal CK and the clock signal CKX is outputted as the recovered clock signal. Further, time-series data of a digital value D(n) is outputted as the recovered data.

Figure 14:
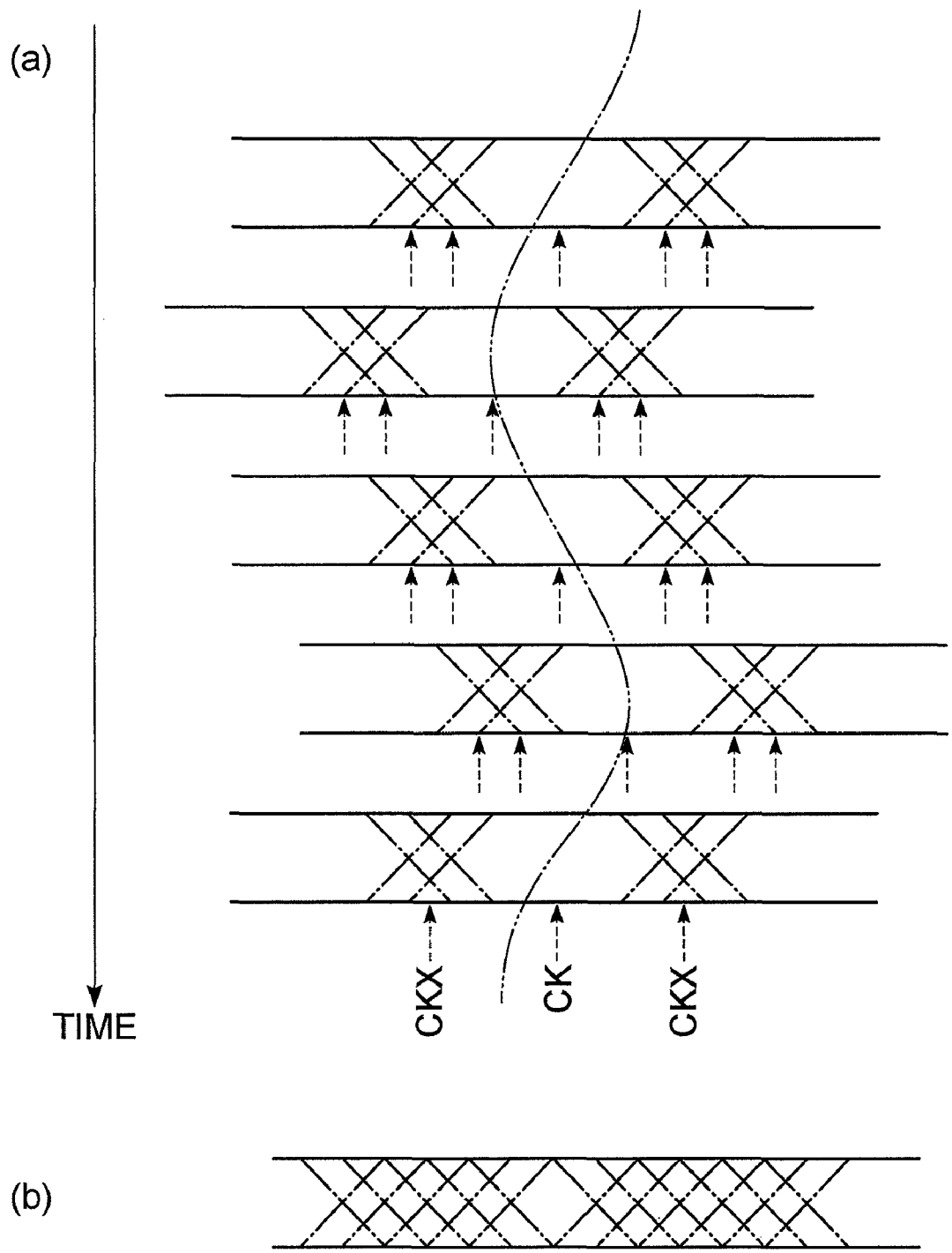
FIG. 14 is a diagram showing the sampling timings respectively indicated by clock signal CK and clock signal CKX in the clock/data recovery device 1 related to the first embodiment.

FIG. 14 is a diagram showing the timings of samplings indicated by each of the clock signal CK and the clock signal CKX in the clock/data recovery device 1 related to the first embodiment. FIG. 14 (*a*) shows how the state in which an eye pattern of the input digital signal changes over time. Further, FIG. 14 (*b*) shows the eye pattern of the input digital signal over a long period of time. A fluctuation in the data transition time of the input digital signal occurs as a result of transmitter clock jitter, which is caused by fluctuations in the power source voltage and other such noise in the transmitter that sent the digital signal, and also fluctuates due to intersymbol interference caused by the mixing of irregular data patterns in the digital signal with the attenuation in the transmission channel.

In FIG. 14 (*a*), the two-dot line, which chronologically connects the center times of the data stability periods, constitutes a curved line caused by transmitter clock jitter. Further, the phenomenon by which the data transition times differ depending on the difference between the value D(n−2) and the value D(n−1) of the preceding two bits is caused by intersymbol interference. In cases where the transmitter clock jitter is high, the eye closes in an eye pattern that spans a long period time of the input digital signal as shown in FIG. 14 (*b*), and when an attempt is made to match the sampling times of the digital signal near the two ends of the data transition time distribution as per the device disclosed in Patent Document 2, the sampling times cannot be established, thereby also making it impossible to establish the center time of the data stability period.

By contrast, in the clock/data recovery device 1 related to the first embodiment, the signal obtained by adding the offset (−Voff) to the input digital signal is regarded as the first signal, and the signal obtained by adding the offset (+Voff) to the input digital signal is regarded as the second signal in the sampler 10, and in each of the $n^{th}$ periods T(n), a digital value DA(n) of the first signal and a digital value DB(n) of the second signal at a time indicated by clock signal CK are sampled, held and outputted, and a digital value DXA(n) of the first signal and a digital value DXB(n) of the second signal at a time indicated by clock signal CKX are sampled, held and outputted.

Then, in this embodiment, "D(n)=DA(n)" and "DX(n)=DXA(n)" are used when value D(n−1) is HIGH level, "D(n)=DB(n)" and "DX(n)=DXB(n)" are used when value D(n−1) is LOW level, the value D(n) and the value DX(n) are determined, and on the basis thereof, the phase relationship between clock signal CK and the digital signal is detected, and the phases of each of the clock signal CK and the clock signal CKX are adjusted. Further, the added offset amount (±Voff) in the sampler 10 is adjusted such that the time indicated by clock signal CKX in a case where the value D(n−1) is HIGH level constitutes the center of the transition time distribution of the values of the first signal, and, in addition, the time indicated by clock signal CKX in a case where the value D(n−1) is LOW level constitutes the center of the transition time distribution of the values of the second signal.

In accordance with this, the timing times indicated by each of the clock signal CK and the clock signal CKX can be determined in a short period of time. That is, the clock/data recovery device 1 related to the first embodiment is able to stably restore the clock signal and data even in cases where transmitter clock jitter and intersymbol interference are high.

Second Embodiment

Figure 15:
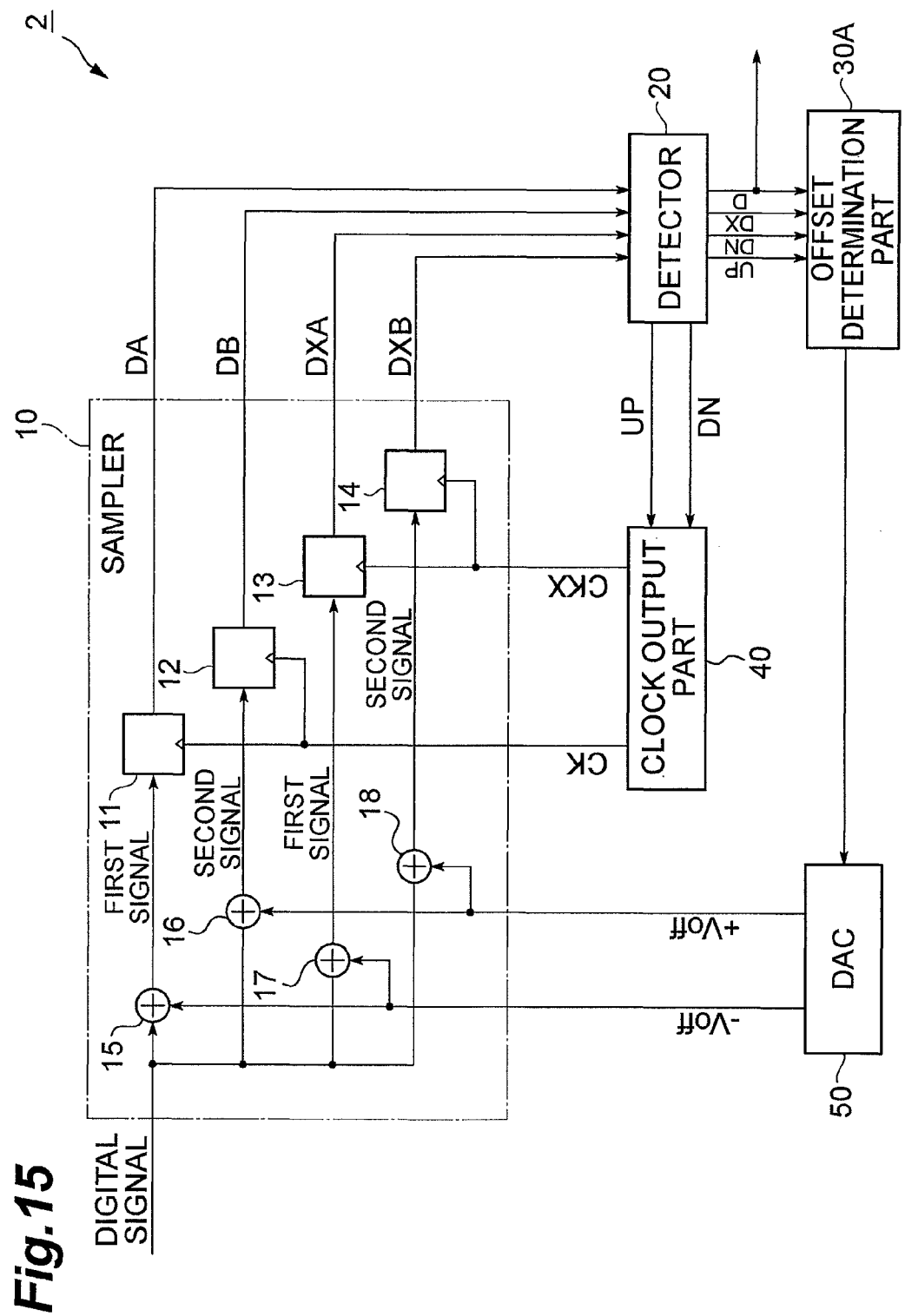
FIG. 15 is a diagram showing a simplified configuration of an entire clock/data recovery device 2 related to a second embodiment.

Next, a second embodiment of the clock/data recovery device related to the present invention will be explained. FIG. 15 is a diagram showing a simplified configuration of the entire clock/data recovery device 2 related to the second embodiment. The clock/data recovery device 2 related to the second embodiment shown in FIG. 15 differs from the configuration of the clock/data recovery device 1 related to the first embodiment shown in FIG. 5 in that the clock/data recovery device 2 comprises an offset determination part 30A instead of the offset determination part 30.

The offset determination part 30A, in each period T(n), receives an input of a digital value D(n) and a digital value DX(n) outputted from the detector 20. Then, offset determination part 30A determines the amount of an offset added in the sampler 10 such that the time indicated by clock signal CKX in a case where the value D(n−1) is HIGH level constitutes the center of the transition time distribution of the values of a first signal, and, in addition, the time indicated by clock signal CKX in a case where the value D(n−1) is LOW level constitutes the center of the transition time distribution of the values of a second signal, and notifies the determined added offset amount to the DA converter 50.

The offset determination part 30A in the second embodiment carries out substantially the same processing as the offset determination part 30 of the first embodiment. This processing differs in the points cited below. In other words, the offset determination part 30A, in each period T(n), determines whether or not to carry out cumulative addition processing for each of the cumulative addition value cntINSIDE and the cumulative addition value cntEDGE in accordance with the value of each of the UP signal and the DN signal that fall within 10 consecutive past periods (T(n−9) through T(n)) including the period.

Figure 16:
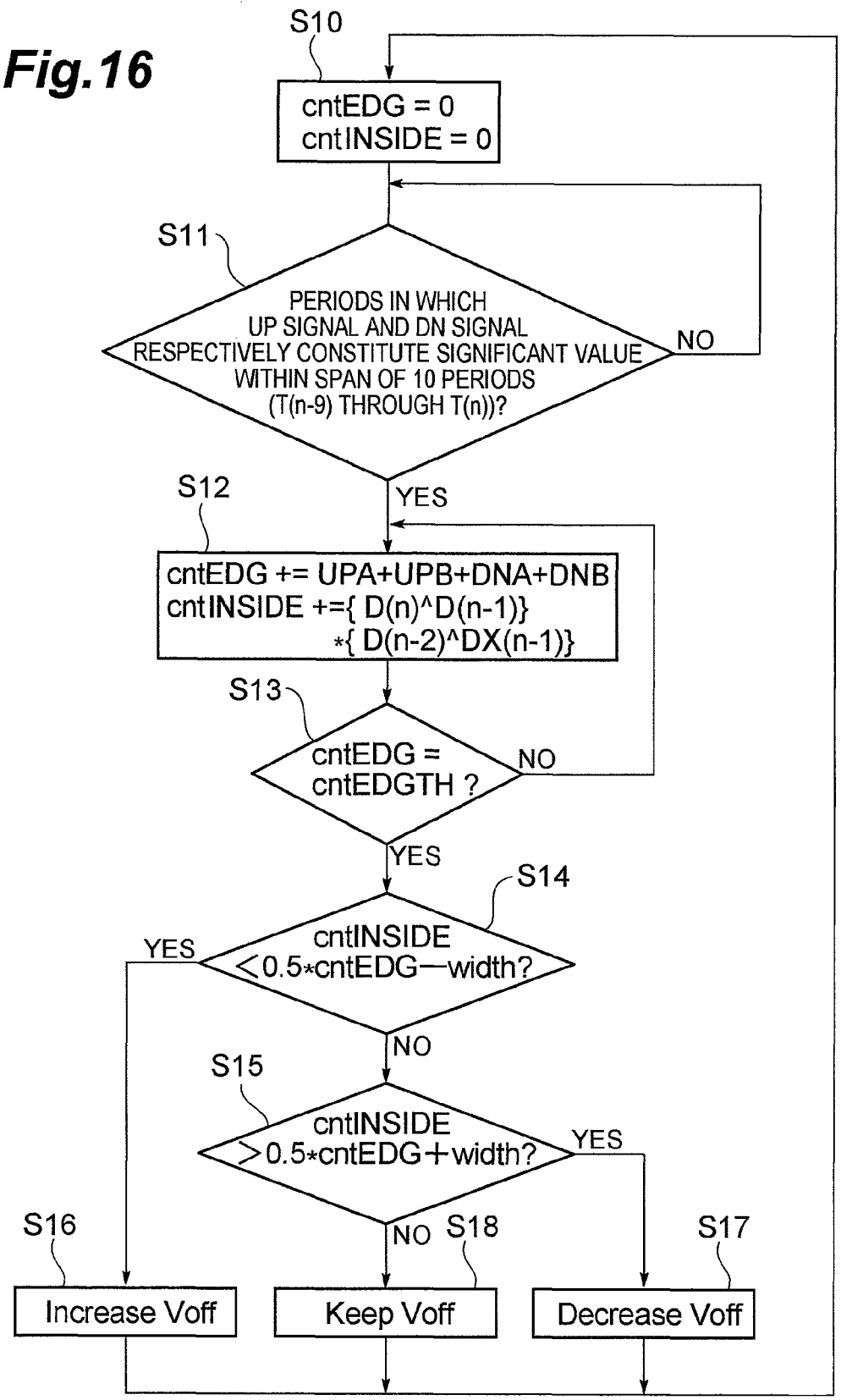
FIG. 16 is a flowchart illustrating the processing in the offset determination part 30A included in the clock/data recovery device 2 related to the second embodiment.

FIG. 16 is a flowchart explaining the processing of the offset determination part 30A included in the clock/data recovery device 2 related to the second embodiment. The processing of the offset determination part 30A of the second embodiment shown in FIG. 16 differs from that of the offset determination part 30 of the first embodiment shown in FIG. 9 in that the processing of the offset determination part 30A further comprises a Step S11 between Step S10 and Step S12.

In Step S11, a determination is made in each period T(n) as to whether or not a period in which the UP signal and the DN signal respectively constitute the significant value exists within the past 10 periods (T(n−9) through T(n)), and when it is determined that such a period exists, processing proceeds to Step S12, and when it is determined that such a period does not exist, the processing of Step S11 is carried out once again in the next period without proceeding to Step S12. FIG. 17 is a diagram illustrating the processing of the offset determination part 30A included in the clock/data recovery device 2 related to the second embodiment. In this figure, the period labeled "UP" is the period in which the UP signal is the significant value, the period labeled "DN" is the period in which the DN signal is the significant value, and the blank columns are periods in which both the UP signal and the DN signal are insignificant values.

That is, in a case where a period in which the UP signal constitutes the significant value exists within the span of 10 periods (T(n−9) through T(n)), and in a case where a period in which the DN signal constitutes the significant value exists within a span of 10 periods (T(n−9) through T(n)) (FIG. 17 (*a*)), the offset determination part 30A, in each period T(n), cumulatively adds "{D(n)^D(n−1)}*{D(n−2) A DX(n−1)}" to determine the cumulative addition value cntINSIDE, and cumulatively adds "D(n)^D(n−1)" to determine the cumulative addition value cntEDGE in Step S12. However, in either a case where the DN signal is always the insignificant value in a span of 10 periods (T(n−9) through T(n)) (FIG. 17 (*b*)), or a case where the UP signal is always the insignificant value in a span of 10 periods (T(n−9) through T(n)) (FIG. 17 (*c*)), the offset determination part 30A does not carry out cumulative addition processing for each of the cumulative addition value cntINSIDE and the cumulative addition value cntEDGE.

Then, when the offset determination part 30A determines that cumulative addition processing was carried out only the number of times of the constant cntEDGTH in Step S13, the offset determination part 30A, in Steps S14 through S18, either increases, decreases or maintains the applied offset amount in accordance with the relationship of the values of each of the variable cntEDG and the variable cntINSIDE, thereby determining the amount of an offset added in the sampler 10 such that the difference between the ratio (cntINSIDE/cntEDGE) and the value 0.5 is not greater than a reference value.

Furthermore, the reason for making a determination in Step S11 as to whether or not the UP signal and the DN signal respectively constitute the significant value over the span of 10 periods is as follows. That is, in a case where there is a data transition between a certain bit and the next bit of the input digital signal, the one of the UP signal and the DN signal constitutes the significant value and the other constitutes the insignificant value. In a case where there is no data transition between a certain bit and the next bit of the input digital signal, both of the UP signal and the DN signal constitute the insignificant value.

If the phases of both the clock signal CK and the clock signal CKX are correct, as shown in FIG. 17 (a), a period in which the UP signal is the significant value, and a period in which the DN signal is the significant value both exist within a succession of a certain plurality of periods. However, if the phases of both the clock signal CK and the clock signal CKX are misaligned, the DN signal always constitutes the insignificant value as shown in FIG. 17 (b) and the UP signal always constitutes the insignificant value as shown in FIG. 17 (c) within the succession of the certain plurality of periods.

Symbol 8B10B, which is used in a serial data communication, guarantees that there are no less than two data transitions within 10 bits. Therefore, if it is determined over the span of 10 periods whether or not there exist periods in which the UP signal and the DN signal respectively constitute the significant value, as long as the phases of both the clock signal CK and the clock signal CKX are correct, there will be a period in which the UP signal constitutes the significant value and also there will be a period in which the DN signal constitutes the significant value in this span of 10 periods.

By contrast, in a case where the DN signal is always the insignificant value over the span of 10 periods, or in a case where the UP signal is always the insignificant value over the span of 10 periods, it is determined that the phases of both the clock signal CK and the clock signal CKX are misaligned, thereby making it impossible to accurately detect the deviation of the added offset amount Voff from the correct value.

Accordingly, the offset determination part 30A of the second embodiment, by making a determination in Step S11 as to whether or not there exist periods within the past 10 consecutive periods in which the UP signal and the DN signal respectively constitute the significant value, determines whether or not the phases of each of the clock signal CK and the clock signal CKX are correct, and if these phases are correct, carries out cumulative addition processing in Step S12.

In accordance with this, the clock/data recovery device 2 related to the second embodiment is able to recover the clock signal and data more stably than in the first embodiment even in cases where transmitter clock jitter and intersymbol interference are high.

Third Embodiment

Figure 18:
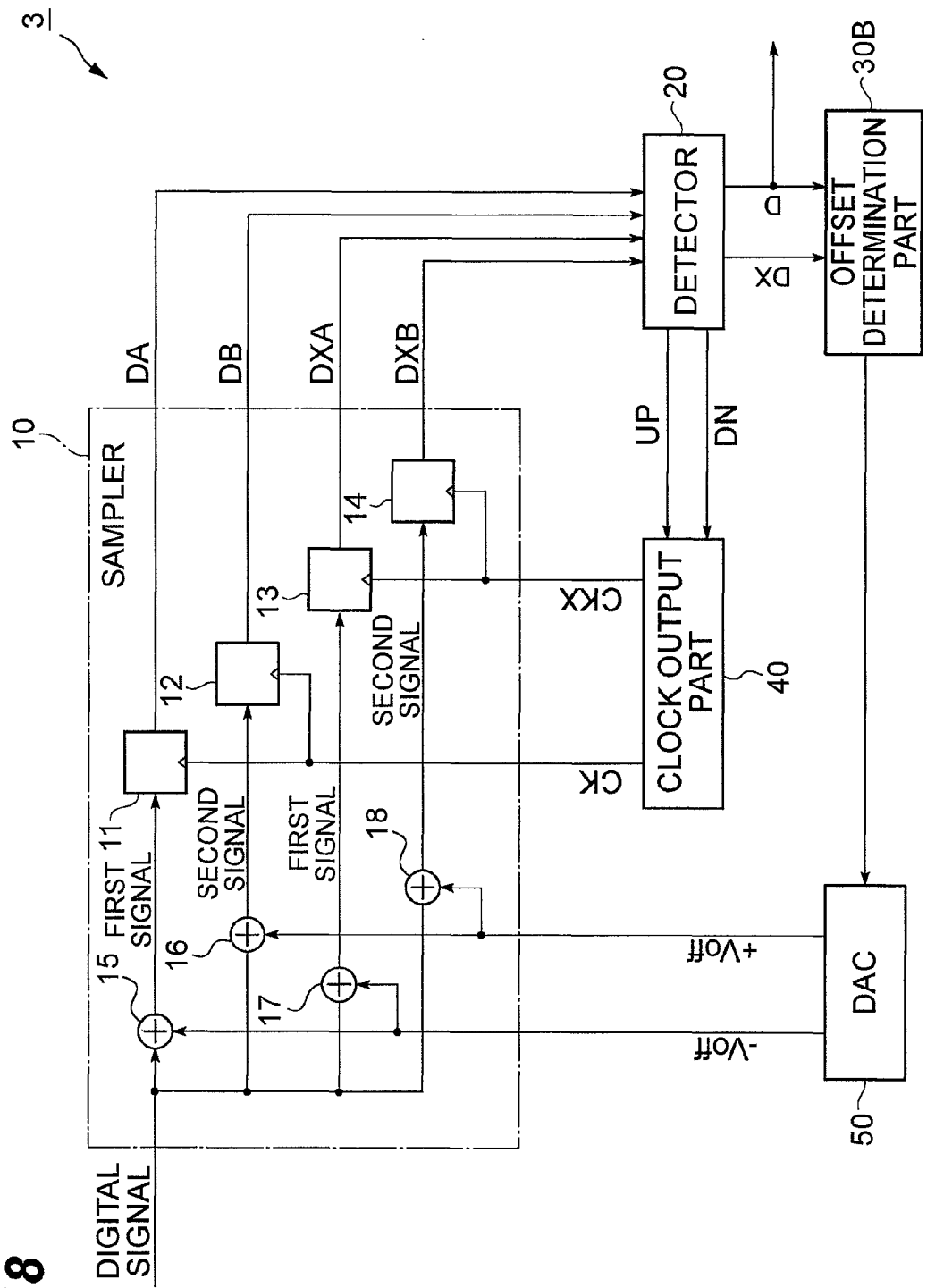
FIG. 18 is a diagram showing a simplified configuration of an entire clock/data recovery device 3 related to a third embodiment.

Next, a third embodiment of the clock/data recovery device related to the present invention will be explained. FIG. 18 is a diagram showing a simplified configuration of the entire clock/data recovery device 3 related to the third embodiment. The clock/data recovery device 3 related to the third embodiment shown in FIG. 18 differs from the configuration of the clock/data recovery device 2 related to the second embodiment shown in FIG. 5 in that clock/data recovery device 3 comprises an offset determination part 30B instead of the offset determination part 30A.

The offset determination part 30B, in each period T(n), inputs a digital value D(n) and a digital value DX(n) outputted from the detector 20. Then, offset determination part 30B determines the amount of an offset added in the sampler 10 such that the time indicated by clock signal CKX in a case where the value D(n-1) is HIGH level constitutes the center of the transition time distribution of the values of a first signal, and, in addition, the time indicated by clock signal CKX in a case where the value D(n-1) is LOW level constitutes the center of the transition time distribution of the values of a second signal, and notifies the determined added offset amount to the DA converter 50.

The offset determination part 30B in the third embodiment carries out substantially the same processing as the offset determination part 30A of the second embodiment, but this processing differs as cited below. In other words, in each period T(n), subsequent to tentatively determining the added offset amount the same as in the second embodiment, the offset determination part 30B determines this added offset value by making corrections in accordance with the value D(n-2), and notifies this post-correction added offset amount to the DA converter 50.

As already explained using FIG. 3, the offset amount for a waveform-degraded digital signal will differ not only at the time of a transition, but also during a stability period, and this offset amount not only depends on the level of the bit preceding the input digital signal, but rather, also depends on the level of the bit immediately before this preceding bit. Therefore, the offset determination part 30B carries out the adjustment of the added offset amount, which is in an equivalence relationship with the voltage threshold level adjustment, to effectively set the voltage threshold level such that the eye margin increases in accordance with the level of the preceding bit. That is, whereas only the level of the bit preceding the input digital signal is considered in the first embodiment and the second embodiment, in the third embodiment, the added offset amount in the sampler 10 is determined by taking into consideration the level of the preceding bit as well as the level of the bit immediately previous thereto.

Figure 19:
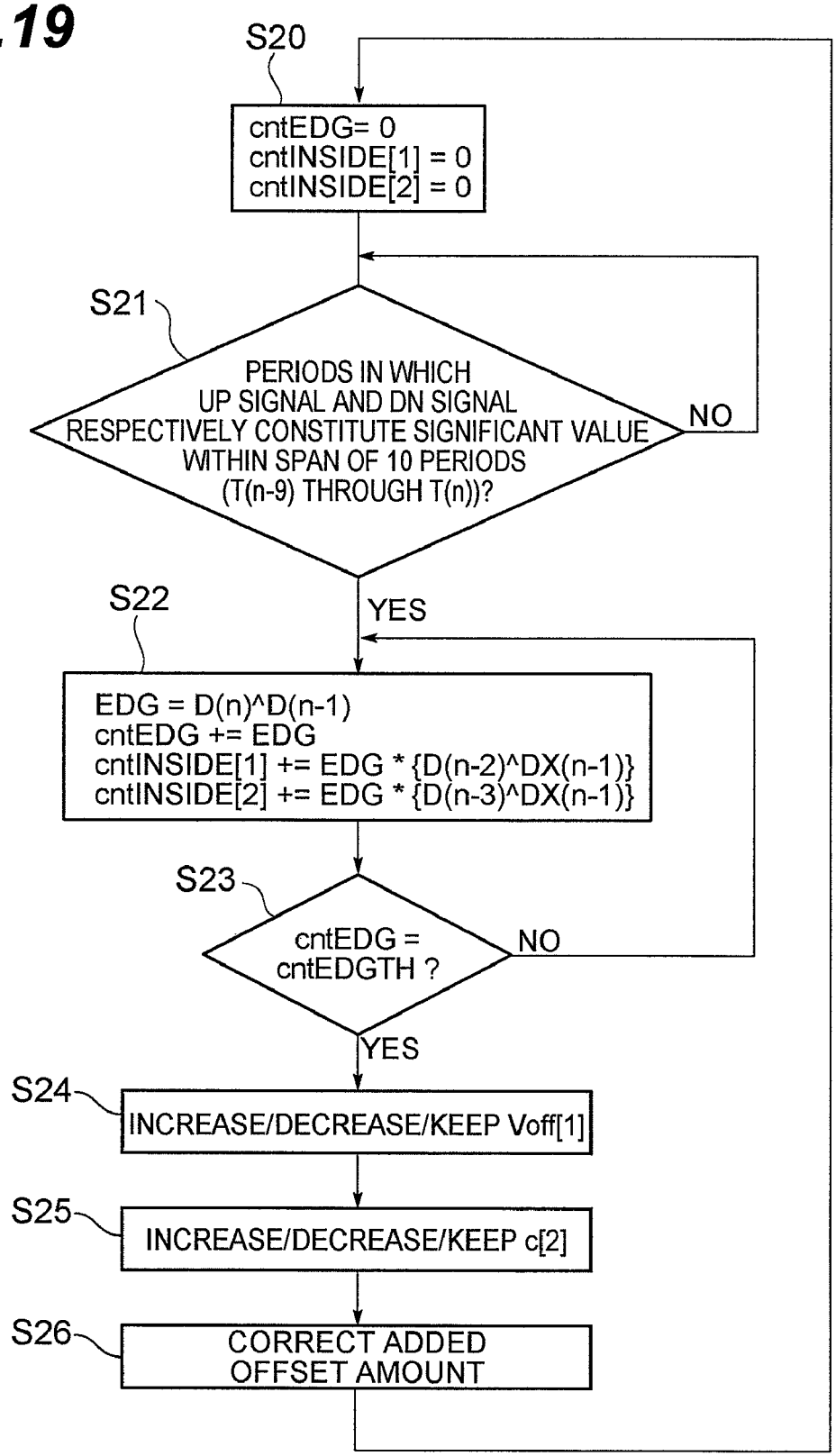
FIG. 19 is a flowchart illustrating the processing in the offset determination part 30B included in the clock/data recovery device 3 related to the third embodiment.

FIG. 19 is a flowchart explaining the processing of the offset determination part 30B included in the clock/data recovery device 3 related to the third embodiment. The offset determination part 30B uses a variable EDG, a variable cntEDG, a variable cntINSIDE[1], a variable cntINSIDE[2], a variable Voff[1], a variable c[2], a constant cntEDGTH, a constant width[1], a constant width[2], a value D(n) and a value DX(n) to carry out the following processing.

In Step S20, each of the variable cntEDG, the variable cntINSIDE[1], and the variable cntINSIDE[2] is set to the initial value 0. Next, in Step S21, a determination is made in each period T(n) as to whether or not there exists periods within the past 10 periods (T(n-9) through T(n)) in which the UP signal and the DN signal respectively constitute the significant value, and when such periods exist, the offset determination part 30B proceeds to Step S22, and when such periods do not exist, the offset determination part 30B carries out the processing of Step S21 once again in the next period without proceeding to Step S22.

In Step S22, the offset determination part 30B sets the value of "D(n)^D(n-1)" to the value of the variable EDGE, adds this to the value of the variable cntEDG, and makes this addition value the new value of the variable cntEDG. In Step S22, the offset determination part 30B adds the value of "EDGE*{D(n-2)^DX(n-1)}" to the value of the variable cntINSIDE[1], and makes this addition value the new value of the variable cntINSIDE[1]. In addition, in Step S22, the offset determination part 30B adds the value of "EDGE*{D(n-3)^DX(n-1)}" to the value of the variable cntINSIDE[2], and makes this addition value the new value of the variable cntINSIDE[2]. The operation symbol "^" here represents an exclusive OR. Next, in Step S23, the offset determination part 30B determines whether or not the value of the variable cntEDG is equivalent to the constant cntEDGTH, and if the value of the variable cntEDG reaches the constant cntEDGTH, proceeds to Step S24, and if the value of the variable cntEDG does not reach the constant cntEDGTH, returns to Step S22.

The processing of each of Step S22 and Step S23 is carried out one time in each period T(n). That is, the processing of Step S22 is carried out one time in each of the periods of cycle T until a determination is made in Step S23 that the value of the variable cntEDG has reached the constant cntEDGTH. Processing then proceeds to Step S24 at the point when it is determined that the value of the variable cntEDG has reached the constant cntEDGTH in Step S23, and the ratio of the value of the variable cntINSIDE with respect to the value of the variable cntEDG denotes whether it is FIG. 8 (*a*) or (*b*).

In Step S24, the offset determination part 30B determines if the value of the variable cntINSIDE[1] is in any way related to a fixed range, which is centered on a value 0.5 times the value of the variable cntEDC; and which has a width of 2width[1], and, in accordance with the result of this determination, either increases, decreases or maintains the variable Voff[1]. That is, in Step S24, the offset determination part 30B carries out different processing in the three cases (a) through (c) as shown hereinbelow. This processing is the same as the processing of Steps S14 through 18 in the first embodiment and the second embodiment.

[E2]
(a) When "cntINSIDE[1]<0.5*cntEDG−width[1]"→increase Voff[1]
(b) When "0.5*cntEDG+width[1]<cntINSIDE[1]"→decrease Voff[1]
(c) When the value of cntINSIDE[1] is within the fixed range→keep Voff[1]

Next, in Step S25, the offset determination part 30B determines if the value of the variable cntINSIDE[2] is in any way related to a fixed range, which is centered on a value 0.5 times the value of the variable cntEDC; and which has a width of 2width[2], and, in accordance with the result of this determination, either increases, decreases or maintains the variable c[2]. That is, in Step S25, the offset determination part 30B carries out different processing in the three cases (a) through (c) as shown hereinbelow. Except for the fact that the variables and the constants targeted for processing differ, the processing of Step S25 is the same as the processing of Step S24.

[E3]
(a) When "cntINSIDE[2]<0.5*cntEDG−width[2]"→increase c[2]
(b) When "0.5*cntEDG+width[2]<cntINSIDE[2]"→decrease c[2]
(c) When the value of cntINSIDE[2] is within the fixed range→keep c[2]

Next, in Step S26, the offset determination part 30B carries out the following operation based on the variable Voff[1] determined in Step S24, the variable c[1] determined in Step S25, and the value D(n−2). That is, the offset determination part 30B determines the offset amount Voff added in the sampler 10, and notifies this determined offset amount Voff to the DA converter 50. Then, the offset determination part 30B returns to Step S20, and repeats the processing that was explained up to this point.

[E4]

$$Voff=Voff[1]+c[2]*d[n-2]$$

Provided that,
d[n−2]=+1 when D[n−2]=1
d[n−2]=−1 when D[n−2]=0

By the offset determination part 30B carrying out the processing described hereinabove, the added offset amount Voff[1] is adjusted and tentatively determined such that the value of the variable cntINSIDE[1] falls within the fixed range (0.5*cntEDG−width[1] through 0.5*cntEDG+width[1]).

Further, the corrected coefficient c[2] is adjusted such that the value of the variable cntINSIDE[2] falls within the fixed range (0.5*cntEDG−width[2] through 0.5*cntEDG+width [2]). Then, the tentatively determined added offset amount Voff[1] is corrected on the basis of the corrected coefficient c[2], and the offset amount Voff added in the sampler 10 is thereby determined.

In the third embodiment, the offset amount Voff added in the sampler 10 is determined by taking into consideration the level of the bit preceding the input digital signal as well as the level of the bit immediately previous thereto. Therefore, the clock/data recovery device 3 related to the third embodiment is able to recover the clock signal and data more stably than in the second embodiment even in cases where transmitter clock jitter and intersymbol interference are high.

Furthermore, the offset determination part 30B may correct the added offset amount in each period T(n) in accordance with the value D(n−3) in addition to the value D(n−2), and may also correct the added offset amount in each period T(n) in accordance with the value D(n−4). For example, in a case where the offset determination part 30B corrects the added offset amount in each period T(n) in accordance with the value D(n−3) in addition to the value D(n−2), the added offset amount Voff is obtained via the following operation. That is, the correction coefficient c[3] is adjusted such that the cumulative addition value of "EDG*{D(n−4)^DX(n−1)}" falls within a fixed range substantially the same as the method for determining the correction coefficient c[2] described above.

[E5]

$$Voff=Voff[1]+c[2]*d[n-2]+c[3]*d[n-3]$$

Provided that,
d[n−2]=+1 when D[n−2]=1
d[n−2]=−1 when D[n−2]=0
d[n−3]=+1 when D[n−3]=1
d[n−3]=−1 when D[n−3]=0

INDUSTRIAL APPLICABILITY

The present invention provides a clock/data recovery device that is capable of stably recovering a clock signal and data even in cases where transmitter clock jitter and intersymbol interference are high.

The invention claimed is:
1. A clock/data recovery device for recovering a clock signal and data based on an input digital signal, comprising:
a sampler for receiving an input of a clock signal CK and a clock signal CKX, which have a same cycle T(n), and also receiving the input digital signal, setting a signal to which an offset (−Voff) has been applied to the input digital signal as a first signal, setting a signal to which an offset (+Voff) has been applied to the input digital signal as a second signal, and in each $n^{th}$ period T(n) of the same cycle, sampling, holding and outputting a digital value DA(n) of the first signal and a digital value DB(n) of the second signal at a time $t_c$ indicated by the clock signal CK, and sampling, holding and outputting a digital value DXA(n) of the first signal and a digital value DXB(n) of the second signal at a time $t_x$ indicated by the clock signal CKX (where "$t_c<t_x$" and n is an integer);
a detector for, in each period T(n), receiving an input of the digital value DA(n), digital value DB(n), digital value DXA(n) and digital value DXB(n) outputted from the sampler, determining a digital value D(n) and a digital value DX(n−1) by setting "D(n)=DA(n)" and "DX(n−1)=DXA(n−1)" in a case where a value D(n−1) is HIGH level and setting "D(n)=DB(n)" and "DX(n−1) =DXB(n−1)" in a case where the digital value D(n−1) is LOW level, and detecting a phase relationship between the clock signal CK and the input digital signal based on the digital value D(n−1), digital value DX(n−1) and digital value D(n);

an offset determination part for, in each period T(n), receiving an input of the digital value D(n) and digital value DX(n) determined by the detector, and determining an amount of an offset (±Voff) added in the sampler such that a time indicated by the clock signal CKX constitutes the center of a transition time distribution of a value of the first signal in a case where the digital value D(n−1) is HIGH level, and a time indicated by the clock signal CKX constitutes the center of a transition time distribution of a value of the second signal in a case where the digital value D(n−1) is LOW level; and a clock output part for adjusting either the cycle T(n) or a phase based on the phase relationship detected by the detector such that a phase difference between the clock signal CK and the input digital signal decreases, and outputting to the sampler the clock signal CK and the clock signal CKX that satisfy the relationship "$t_x - t_c = T/2$".

2. The clock/data recovery device according to claim 1, wherein the detector comprises a phase relationship detection circuit for outputting, as signals representing the phase relationship, a UP signal which constitutes a significant value when "D(n−1)≠DX(n−1)=D(n)", and a DN signal which constitutes a significant value when "D(n−1)=DX(n−1)≠D(n)".

3. The clock/data recovery device according to claim 2, wherein the clock output part adjusts either the cycle T(n) or the phase based on the UP signal and the DN signal, and outputs the clock signal CK and the clock signal CKX.

4. The clock/data recovery device according to claim 1, wherein the offset determination part determines the amount of an offset added in the sampler such that the difference between a value of 0.5 and the ratio (cntINSIDE/cntEDGE) of a cumulative addition value cntINSIDE of "{D(n)^D(n−1)}*{D(n−2)^DX(n−1)}" and a cumulative addition value cntEDGE of "D(n)^D(n−1)" is not greater than a reference value.

5. The clock/data recovery device according to claim 2, wherein in each period T(n), only in a case where there exists a period in which the UP signal and the DN signal respectively constitute the significant value within past 10 consecutive periods (T(n−9) through T(n)) including this period, the offset determination part cumulatively adds "{D(n)^D(n−1)}* {D(n−2)^DX(n−1)}" to determine the cumulative addition value cntINSIDE, and cumulatively adds "D(n)^D(n−1)" to determine the cumulative addition value cntEDGE; and determines the amount of an offset added in the sampler such that the difference between the value of 0.5 and the ratio (cntINSIDE/cntEDGE) is not greater than a reference value.

6. The clock/data recovery device according to claim 4, wherein the offset determination part corrects the added offset amount in accordance with a value D(n−2) in each period T(n).

7. The clock/data recovery device according to claim 5, wherein the offset determination part corrects the added offset amount in accordance with a value D(n−2) in each period T(n).

* * * * *